US011095137B2

(12) United States Patent
Jang et al.

(10) Patent No.: US 11,095,137 B2
(45) Date of Patent: Aug. 17, 2021

(54) WIRELESS POWER TRANSMISSION DEVICE FOR VEHICLE

(71) Applicant: AMOSENSE CO., LTD, Cheonan-si (KR)

(72) Inventors: Kil Jae Jang, Seongnam-si (KR); Beom Jin Kim, Bucheon-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 0 days.

(21) Appl. No.: 16/489,845

(22) PCT Filed: Dec. 8, 2017

(86) PCT No.: PCT/KR2017/014365
§ 371 (c)(1),
(2) Date: Aug. 29, 2019

(87) PCT Pub. No.: WO2018/164350
PCT Pub. Date: Sep. 13, 2018

(65) Prior Publication Data
US 2020/0235593 A1    Jul. 23, 2020

(30) Foreign Application Priority Data

Mar. 9, 2017 (KR) .................. 10-2017-0030093
Dec. 7, 2017 (KR) .................. 10-2017-0167245

(51) Int. Cl.
*H02J 5/00* (2016.01)
*H02J 7/00* (2006.01)
(Continued)

(52) U.S. Cl.
CPC ........... *H02J 7/0044* (2013.01); *H01Q 1/526* (2013.01); *H02J 7/00309* (2020.01);
(Continued)

(58) Field of Classification Search
CPC .. H01Q 1/52; H01Q 1/526; H05K 7/20; H02J 2310/40; H02J 7/0044; H02J 7/00309;
(Continued)

(56) References Cited

U.S. PATENT DOCUMENTS

2008/0197956 A1* 8/2008 Hasegawa ............... H01F 38/14
336/61
2011/0043050 A1* 2/2011 Yabe .................... H04B 5/0087
307/104

(Continued)

FOREIGN PATENT DOCUMENTS

JP    2013197405    9/2013
KR    20130000926   1/2013
(Continued)

OTHER PUBLICATIONS

International Search Report—PCT/KR2017/014365 dated Mar. 23, 2018.

*Primary Examiner* — Jared Fureman
*Assistant Examiner* — Esayas G Yeshaw
(74) *Attorney, Agent, or Firm* — Cantor Colburn LLP

(57) ABSTRACT

A wireless power transmission device for a vehicle is provided. A wireless power transmission device for a vehicle comprises: a magnetic field shielding sheet having a plate shape and a predetermined area, at least one wireless power transmission antenna disposed on a first surface of the magnetic field shielding sheet, and a wireless communication antenna formed in an antenna pattern on at least one surface of a circuit board, wherein the circuit board is disposed on a second surface of the magnetic field shielding sheet which is a surface opposite to the first surface.

18 Claims, 18 Drawing Sheets

(51) Int. Cl.
  *H02J 50/80* (2016.01)
  *H02J 50/12* (2016.01)
  *H02J 50/70* (2016.01)
  *H02J 50/00* (2016.01)
  *H01Q 1/52* (2006.01)

(52) U.S. Cl.
  CPC ............ *H02J 50/005* (2020.01); *H02J 50/12* (2016.02); *H02J 50/70* (2016.02); *H02J 50/80* (2016.02); *H02J 2310/40* (2020.01)

(58) Field of Classification Search
  CPC .......... H02J 50/70; H02J 50/80; H02J 50/005; H02J 7/02; H02J 50/12; H04B 5/00
  See application file for complete search history.

(56) References Cited

U.S. PATENT DOCUMENTS

| | | | | |
|---|---|---|---|---|
| 2012/0062435 | A1* | 3/2012 | Kato | H01Q 7/06 343/787 |
| 2013/0249312 | A1* | 9/2013 | Uchida | H01F 38/14 307/104 |
| 2014/0035381 | A1* | 2/2014 | Chen | H02J 7/025 307/104 |
| 2015/0340754 | A1* | 11/2015 | Asou | H01Q 7/00 343/788 |
| 2015/0349537 | A1* | 12/2015 | Milne | H01Q 7/00 307/104 |
| 2016/0226310 | A1* | 8/2016 | Muratov | H01F 27/36 |
| 2017/0025886 | A1* | 1/2017 | Rohmer | H02J 7/0044 |
| 2017/0345555 | A1* | 11/2017 | Jang | H04B 5/0037 |
| 2019/0074577 | A1* | 3/2019 | Kim | H01Q 1/52 |
| 2019/0228902 | A1* | 7/2019 | Wu | H02J 50/10 |
| 2019/0363565 | A1* | 11/2019 | Graham | H01F 38/14 |

FOREIGN PATENT DOCUMENTS

| | | |
|---|---|---|
| KR | 20150072138 | 6/2015 |
| KR | 101559939 | 10/2015 |
| KR | 20150113747 | 10/2015 |
| KR | 101697303 | 1/2017 |
| KR | 101703157 | 2/2017 |

* cited by examiner

200

WIRELESS POWER TRANSMISSION DEVICE FOR VEHICLE

TECHNICAL FIELD

The present invention relates to a wireless power transmission technology, and more particularly, to a wireless power transmission device for vehicles which may be installed in a vehicle to charge batteries of an electronic device.

BACKGROUND ART

Recently, usage of electric devices with a battery which is charged by external power, for example, usage of a portable electronic device, such as a mobile phone, a smartphone, a tablet personal computer (PC), a notebook computer, a digital broadcasting terminal, a personal digital assistant (PDA), a portable multimedia player (PMP), or a navigation system, has been increased.

In the portable electronic device, the battery of the electronic device is often charged through a charger while moving in a dynamic space such as a vehicle.

To this end, a method capable of easily charging batteries of electronic devices in a vehicle by transmitting power supplied from the vehicle in a wireless manner has been proposed.

Meanwhile, near field communication (NFC) is a technology capable of transmitting data between terminals at a close distance within 10 cm in a contactless communication method. Recently, electronic devices include functions such as data transmission through NFC in addition to wireless charging.

Accordingly, a user having an electronic device to which an NFC technology is applied may conveniently check various information of a vehicle by receiving the information of the vehicle through the electronic device.

However, when the electronic device does not smoothly perform wireless charging and data transmission at the same position, there is an inconvenience that the user has to move the electronic device to a position in which the wireless charging is smoothly performed or move the electronic device to a position in which the data transmission is smoothly performed.

Accordingly, there is a need for a solution in which both data transmission and wireless charging may be smoothly performed even without changing the position of an electronic device in a vehicle.

DISCLOSURE

Technical Problem

The present invention is directed to providing a wireless power transmission device for vehicles capable of smoothly performing both data communication and wireless charging without changing the position of an electronic device.

The present invention is also directed to providing a wireless power transmission device for vehicles capable of improving the problem of heat generated during wireless charging.

Technical Solution

One aspect of the present invention provides a wireless power transmission device including at least one wireless power transmission antenna for power transmission, a wireless communication antenna formed in an antenna pattern on at least one surface of a circuit board, and a magnetic field shielding sheet having a plate shape and disposed on one surface of the wireless power transmission antenna, wherein the circuit board on which the wireless communication antenna is formed is disposed to be located above the wireless power transmission antenna.

The wireless power transmission antenna may be formed of a planar coil having a hollow portion, and the wireless communication antenna may include a first patterned portion disposed on a region corresponding to the wireless power transmission antenna and a second patterned portion disposed on a region which does not correspond to the wireless power transmission antenna.

The first patterned portion may be formed such that a portion thereof which is located directly above a coil body of the planar coil has a relatively longer length or wider area than a portion thereof which is located directly above the hollow portion or has a relatively shorter length or narrower area than the portion thereof which is located directly above the hollow portion.

Another aspect of the present invention provides a wireless power transmission device including a magnetic field shielding sheet having a plate shape and a predetermined area, at least one wireless power transmission antenna disposed on a first surface of the magnetic field shielding sheet, and a wireless communication antenna formed in an antenna pattern on at least one surface of a circuit board, wherein the circuit board is disposed on a second surface of the magnetic field shielding sheet which is a surface opposite to the first surface.

The circuit board may include a protruding region which protrudes outward from an edge of the magnetic field shielding sheet, and the wireless communication antenna may be patterned in the protruding region.

The wireless power transmission device may include a planar heat-dissipating member to increase a heat-dissipating property.

The wireless power transmission device may include a supporting plate to increase both alignment workability and a heat-dissipating property in a case in which the wireless power transmission antenna is configured with a plurality of antennas.

The wireless power transmission device may include a housing including at least one circuit board built therein for an overall operation and configured to release heat generated by a heat source, and a heat-dissipating coating layer applied to an outer surface of the housing to improve a heat-dissipating property.

Advantageous Effects

According to the present invention, even when an electronic device is located at the same position without changing its position, both data communication and wireless charging can be smoothly performed by optimizing the arrangement position of the near field communication (NFC) antenna, thereby improving usability.

In addition, according to the present invention, since a plurality of planar coils can be conveniently disposed according to the certification standard using a supporting plate, assembling productivity can be increased, heat-dissipating performance can be improved by a heat-dissipating member, and assembling property and fastening property with other components can be increased.

Furthermore, according to the present invention, the surface temperature of a cover during wireless charging can be lowered by increasing the heat-dissipating performance of a housing using a heat-dissipating coating layer.

DESCRIPTION OF DRAWINGS

FIG. 20 is a schematic view illustrating a detailed configuration of a heat-dissipating member forming composition which may be realized as the housing in the form of FIGS. 15 and 18, FIGS. 21A and 21B are schematic views illustrating a graphite composite applied to FIG. 20, wherein

MODES OF THE INVENTION

Figure 1:
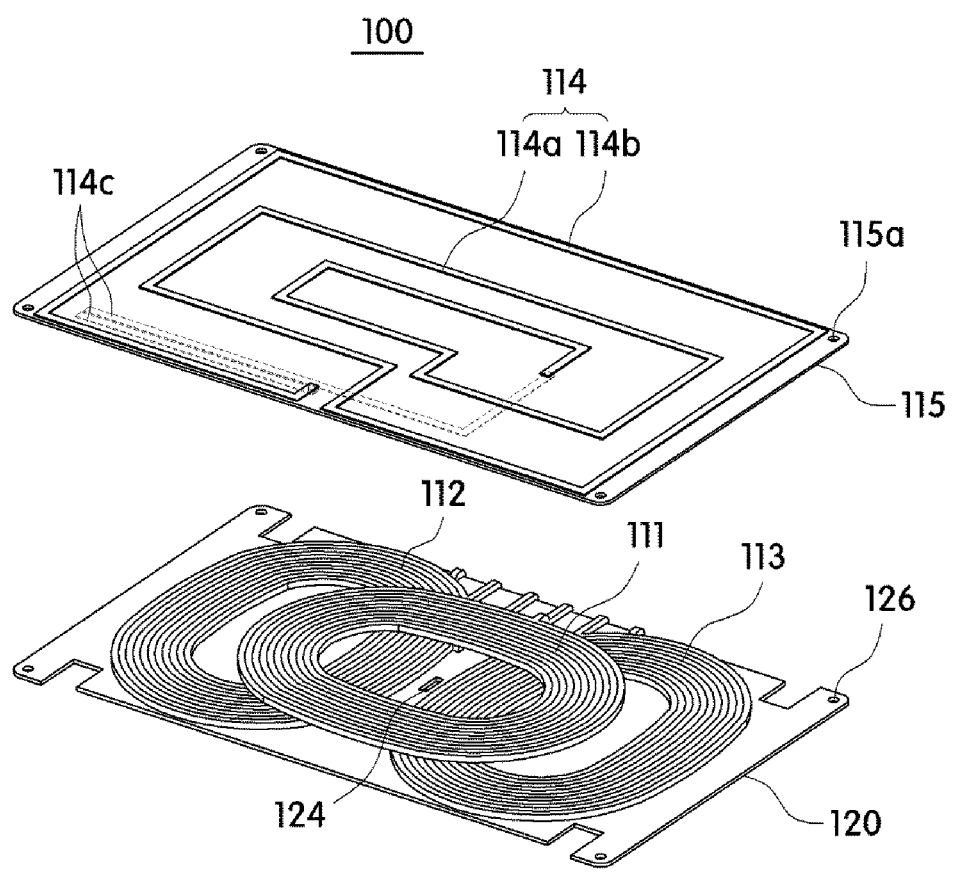
FIG. 1 is a view illustrating a wireless power transmission device according to one embodiment of the present invention.

Hereinafter, embodiments of the present invention will be described in detail with reference to the accompanying drawings so that those of ordinary skill in the art to which the present invention pertains may readily implement the embodiments. The present invention may be embodied in many different forms and is not limited to the embodiments set forth herein. In the drawings, a part which is not related to the description is omitted to clearly describe the present invention, and the same reference numerals throughout the specification are used for the same or similar components or elements.

A vehicle wireless power transmission device 100 or 200 according to one embodiment of the present invention may be equipped or installed in a vehicle, and may charge a battery included in an electronic device with power by transmitting wireless power toward a wireless power reception module built in a portable electronic device when the portable electronic device such as a smartphone is disposed on an upper side of the vehicle wireless power transmission device 100 or 200. In addition, in the vehicle wireless power transmission device 100 or 200 according to one embodiment of the present invention, near field communication (NFC) may be smoothly performed at the same position as a position in which the battery is charged.

In the present invention, the electronic device may be one of portable electronic devices such as a mobile phone, a personal digital assistant (PDA), a portable multimedia player (PMP), a tablet, and a multimedia device.

To this end, the vehicle wireless power transmission device 100 or 200 according to one embodiment of the present invention includes an antenna unit and a magnetic field shielding sheet 120 as shown in FIGS. 1 to 6.

The antenna unit performs various functions such as data communication and wireless power transmission using a predetermined frequency band. To this end, the antenna unit may include a plurality of antennas, and the plurality of antennas may perform different functions.

For example, the antenna unit may include one or more wireless power transmission antennas 111, 112, and 113 for transmitting wireless power toward the wireless power reception module, and a wireless communication antenna 114 or 214 for data communication.

In the present invention, the antennas 111, 112, 113, 114, and 214 may be configured by a circular, elliptical, or rectangular planar coil formed by winding a conductive member having a predetermined length multiple times in a clockwise or counterclockwise direction or may be an antenna pattern formed by patterning a conductor such as a copper foil on one surface of a circuit board 115 or 215 in a loop shape or formed of a loop-shaped metal pattern using conductive ink. Here, the circuit board 115 or 215 may be formed of a flexible circuit board made of a material such as polyimide (PI) and polyethylene terephthalate (PET), or a rigid circuit board made of a material such as FR4.

Further, the wireless power transmission antennas 111, 112, and 113 may transmit power by an inductive coupling method or a magnetic resonance method based on an electromagnetic induction phenomenon, and the wireless communication antenna 114 or 214 may be formed of an NFC type antenna. In addition, the wireless power transmission antennas 111, 112, and 113 may be a Qi standard or Power Matters Alliance (PMA) standard antenna which operates in a frequency band of 100 to 350 kHz by a magnetic induction method or an Alliance for Wireless Power (A4WP) standard antenna which operates at 6.78 MHz by a magnetic resonance method, or may have a form in which at least two of the Qi standard, the PMA standard, and the A4WP standard are combined. In addition, the wireless communication antenna 114 or 214 may transmit and receive data using the frequency of 13.56 MHz.

Figure 4:
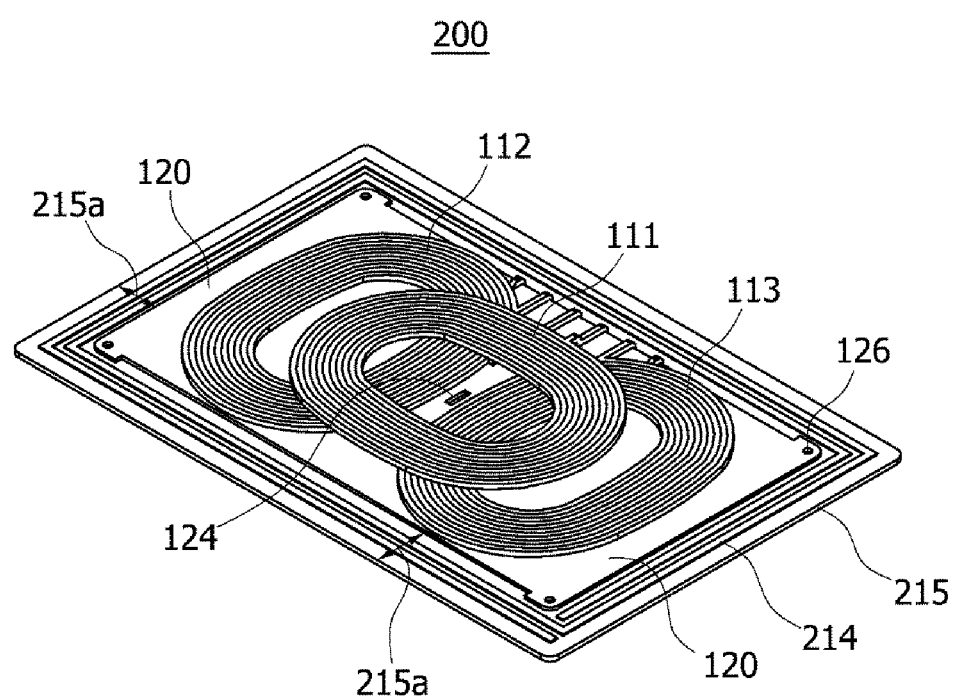
FIG. 4 is a view illustrating a wireless power transmission device according to another embodiment of the present invention.

Here, the wireless power transmission antennas 111, 112, and 113 may be provided as a plurality of antennas as shown in FIGS. 1 and 4, and at least some of the wireless power transmission antennas 111, 112, and 113 may be stacked over the other to overlap each other. Specifically, the wireless power transmission antennas 111, 112, and 113 may be provided as three planar coils, and one planar coil 111 of the three planar coils may be disposed above the remaining two planar coils 112 and 113 so as to partially overlap the remaining two planar coils 112 and 113.

Hereinafter, for convenience of description, the two planar coils which are disposed on the same plane are referred to as a second coil 112 and a third coil 113, and the planar coil which is stacked on one surface of each of the second coil 112 and the third coil 113 is referred to as a first coil 111.

However, the number and the arrangement relationship of the wireless power transmission antennas applied to the present invention are not limited thereto, and the total number of the planar coils and the vertical arrangement relationship of the first coil 111, the second coil 112, and the third coil 113 may be changed in various manners.

Meanwhile, the wireless communication antenna 114 or 214 may transmit and receive data to/from the portable electronic device. Through this, various information of the vehicle may be transmitted to the portable electronic device or a function such as a startup/shutoff of the vehicle or a lock/unlock of a door may be controlled by a signal transmitted from the portable electronic device.

The wireless communication antenna 114 or 214 may be an antenna pattern formed by patterning a conductor in a loop shape on at least one surface of the circuit board 115 or 215.

Here, the wireless power transmission device 100 or 200 according to one embodiment of the present invention may smoothly perform both data communication and wireless power transmission at the same position without changing the position of the portable electronic device.

That is, in the wireless power transmission device 100 or 200 according to one embodiment of the present invention, the wireless communication antenna 114 or 214 may be disposed at an appropriate position with respect to the wireless power transmission antennas 111, 112, and 113 so that both the data communication and the wireless power transmission may be smoothly performed at the same position.

For example, in a case in which the portable electronic device is disposed at a position corresponding to the wireless power transmission antennas 111, 112, and 113, both the wireless charging using the wireless power transmission antennas 111, 112, and 113 and the data communication using the wireless communication antenna 114 or 214 may be performed smoothly.

Figure 2:
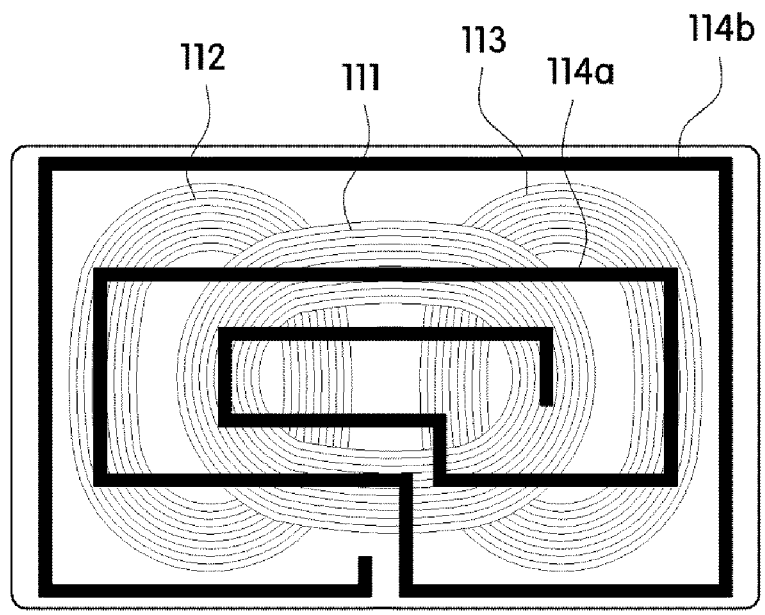
FIG. 2 is a view illustrating an arrangement relationship between a wireless communication antenna and a wireless power transmission antenna in FIG. 1.
Figure 3:
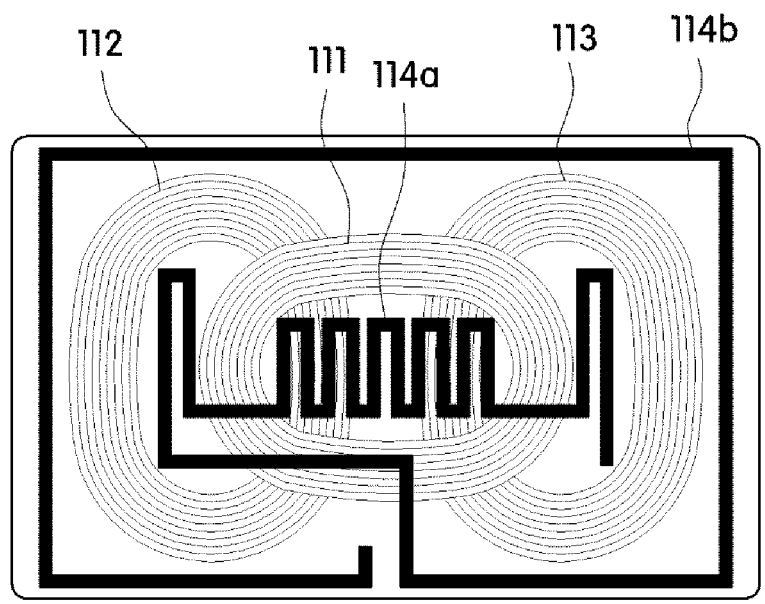
FIG. 3 is a view illustrating an arrangement relationship between other types of wireless communication antenna and wireless power transmission antenna, which can be applicable to FIG. 1.

To this end, as shown in FIGS. 1 to 3, the wireless power transmission device 100 according to one embodiment of the present invention may be disposed such that the circuit board 115 on which the wireless communication antenna 114 is patterned is positioned on an upper side of the first coil 111.

In this case, the circuit board 115 may be stacked on the upper side of the first coil 111, and as shown in FIGS. 2 and 3, at least a part of the pattern among the antenna pattern constituting the wireless communication antenna 114 may be disposed directly above a region corresponding to the wireless power transmission antennas 111, 112, and 113.

In the present embodiment, the circuit board 115 may be attached to one surface of the first coil 111 through an adhesive member and may include at least one fastening hole 115a formed on a corner side thereof, thereby being coupled with other components through a fastening member such as a bolt member. In addition, the circuit board 115 may be in contact with the first coil 111, but may be disposed to be spaced apart from the upper side of the first coil 111 at a predetermined interval.

Here, the wireless communication antenna 114 may include a first patterned portion 114a disposed in the region corresponding to the wireless power transmission antennas 111, 112, and 113 and a second patterned portion 114b disposed in the region that does not correspond to the wireless power transmission antennas 111, 112, and 113. In addition, a pair of terminals 114c may be formed on one surface of the circuit board 115 to be electrically connected to other components.

In the present invention, the region corresponding to the wireless power transmission antennas 111, 112, and 113 may be defined as a region including a coil body and a hollow portion constituting the planar coil, and the region that does not correspond to the wireless power transmission antennas 111, 112, and 113 may be defined as the remaining region excluding the coil body and the hollow portion constituting the planar coil.

In this case, the second patterned portion 114b may be formed to be located on an edge side along the edge of the circuit board 115, and the first patterned portion 114a may be formed to be located on an inner side of the circuit board 115 and an inner side of the second patterned portion 114b. Accordingly, in the wireless power transmission device 100 according to the present embodiment, in a case in which the circuit board 115 is disposed on the upper side of the first coil 111, the first patterned portion 114a may be located above the region corresponding to the wireless power transmission antennas 111, 112, and 113.

Therefore, in a case in which the portable electronic device is disposed above the region corresponding to the wireless power transmission antennas 111, 112, and 113, both the wireless charging using the wireless power transmission antennas 111, 112, and 113 and the data communication using the wireless communication antenna 114 may be performed at the same position even when the position of the portable electronic device is not changed.

Here, the first patterned portion 114a formed at the position corresponding to the wireless power transmission antennas 111, 112, and 113 may be patterned in various ways depending on design conditions. For example, as shown in FIG. 2, the first patterned portion 114a may be patterned such that a portion thereof which is located directly above the planar coil body constituting the wireless power transmission antennas 111, 112, and 113 has a relatively longer length or a wider area than a portion thereof which is located directly above the hollow portion of the planar coil.

Alternatively, as shown in FIG. 3, the first patterned portion 114a may be patterned such that the portion thereof which is located directly above the planar coil body constituting the wireless power transmission antennas 111, 112, and 113 has a relatively shorter length or a narrower area than the portion thereof which is located directly above the hollow portion of the planar coil. That is, the first patterned portion 114*a* may be patterned to be concentrically disposed on the hollow portion side of the planar coil.

However, the patterning method of the first patterned portion 114*a* is not limited thereto and may be changed in various ways depending on design conditions, and a line width of the antenna pattern constituting the wireless communication antenna 114, a separation distance between the patterns, and the like may all be appropriately changed. In addition, it is noted that the wireless communication antenna 114 may be formed of only the first patterned portion 114*a* disposed on the region corresponding to the wireless power transmission antennas 111, 112, and 113.

Figure 5:
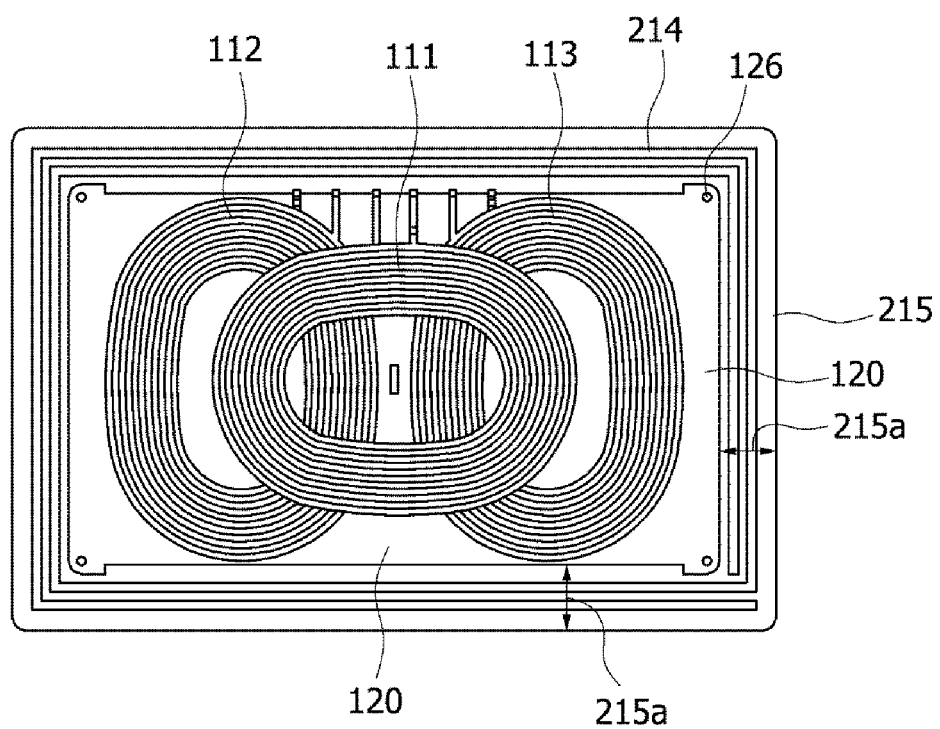
FIG. 5 is a view illustrating an arrangement relationship between a wireless communication antenna and a wireless power transmission antenna in FIG. 4.
Figure 6:
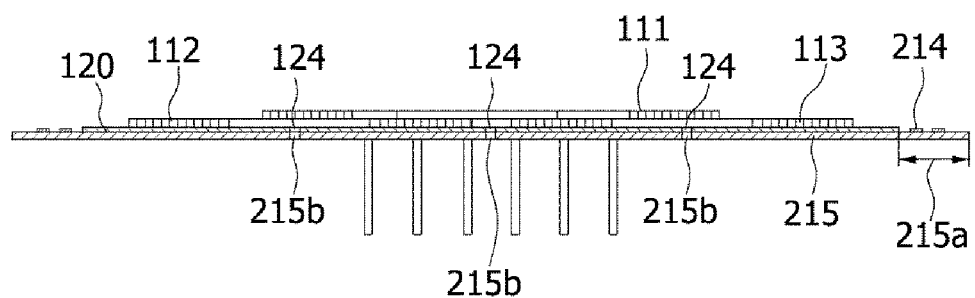
FIG. 6 is a cross-sectional view of FIG. 4.

As another example, as shown in FIGS. 4 to 6, the wireless power transmission device 200 according to one embodiment of the present invention may be disposed such that the circuit board 215 on which the wireless communication antenna 214 is patterned is positioned on a lower side of the magnetic field shielding sheet 120.

In this case, the wireless power transmission antennas 111, 112, and 113 may be disposed on a first surface of the magnetic field shielding sheet 120, and the circuit board 215 on which the wireless communication antenna 214 is patterned may be disposed on a second surface of the magnetic field shielding sheet 120, which is a surface opposite to the first surface.

Here, the circuit board 215 may be provided to have a relatively wider area than the magnetic field shielding sheet 120, and the magnetic field shielding sheet 120 may be disposed to be located on an inner side of the circuit board 215.

Accordingly, as shown in FIGS. 4 and 5, in a case in which the circuit board 215 is disposed on the second surface of the magnetic field shielding sheet 120, the circuit board 215 may include a protruding region 215*a* which protrudes outward from an edge of the magnetic field shielding sheet 120, and the protruding region 215*a* may be disposed to surround the edge of the magnetic field shielding sheet 120.

Here, the wireless communication antenna 214 may be patterned in the protruding region 215*a*.

Accordingly, the wireless communication antenna 214 may be disposed outside the wireless power transmission antennas 111, 112, and 113, and since the patterned portion of the wireless communication antenna 214 is not covered by the magnetic field shielding sheet 120, the patterned portion of the wireless communication antenna 214 may smoothly operate.

Therefore, in a case in which the portable electronic device is disposed above the region corresponding to the wireless power transmission antennas 111, 112, and 113, both the wireless charging using the wireless power transmission antennas 111, 112, and 113 and the data communication using the wireless communication antenna 214 may be performed at the same position even when the position of the portable electronic device is not changed.

The magnetic field shielding sheet 120 may be formed of a plate-shaped member having a predetermined area and may be disposed on one surface of the wireless power transmission antennas 111, 112, and 113. The magnetic field shielding sheet 120 may shield magnetic fields generated by the wireless power transmission antennas 111, 112, and 113 and may increase the focusability of the magnetic fields in a required direction, thereby increasing the performance of the antenna operating in a predetermined frequency band.

To this end, the magnetic field shielding sheet 120 may be made of a magnetic material.

For example, an amorphous ribbon sheet, a ferrite sheet, a polymer sheet, or the like may be used as the magnetic field shielding sheet 120. The amorphous ribbon sheet may be a ribbon sheet including at least one of an amorphous alloy and a nanocrystalline alloy, the amorphous alloy may include a Fe-based or Co-based magnetic alloy, and the ferrite sheet may be a sintered ferrite sheet such as Mn—Zn ferrite or Ni—Zn ferrite.

Further, the magnetic field shielding sheet 120 may be divided into a plurality of minute pieces through a flake process for increasing the entire resistance to suppress generation of eddy current or increase flexibility, and the plurality of minute pieces may be formed to be atypical.

In addition, the magnetic field shielding sheet 120 may have a form in which a plurality of magnetic sheets are stacked in multiple layers through an adhesive layer, each of the plurality of magnetic sheets may have a form in which is divided into a plurality of minute pieces through a flake process, and the adjacent minute pieces may be entirely or partially insulated from each other.

Since the magnetic field shielding sheet 120 has a known configuration, detailed description thereof will be omitted, and it is noted that as the materials for the shielding sheet, all known materials which are generally used may be used.

Meanwhile, as shown in FIGS. 7 to 12, the wireless power transmission device 100 or 200 according to one embodiment of the present invention may further include a supporting plate 130 configured to fix the positions of a plurality of planar coils 111, 112, and 113 in a case in which the wireless power transmission antennas 111, 112, and 113 are provided as the plurality of planar coils, and at least one planar coil is stacked on one surfaces of the other planar coils That is, in the wireless power transmission device according to the present embodiment, in a case in which the plurality of planar coils 111, 112, and 113 are stacked in multiple layers, and parts of the plurality of planar coils 111, 112, and 113 are disposed to overlap each other, overlapping regions A1, A2, A3, and A4 may be formed between the planar coils in desired positions with desired areas by the supporting plate 130.

Figure 7:
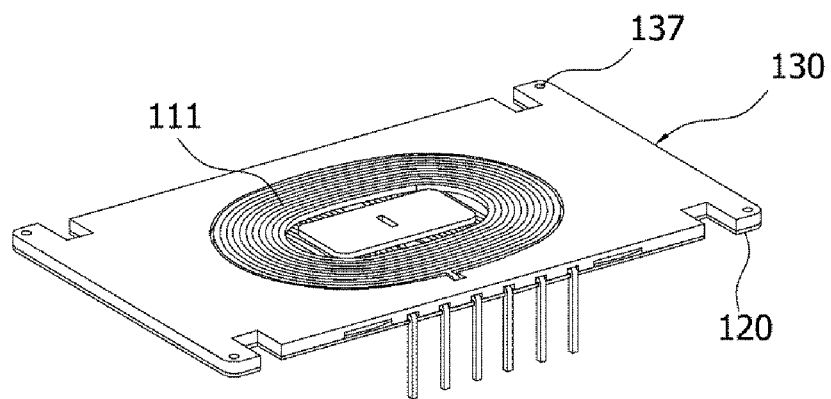
FIG. 7 is a view illustrating a coupling relationship between a supporting plate and the wireless power transmission antenna when the supporting plate is applied to the wireless power transmission device according to the present invention.
Figure 8:
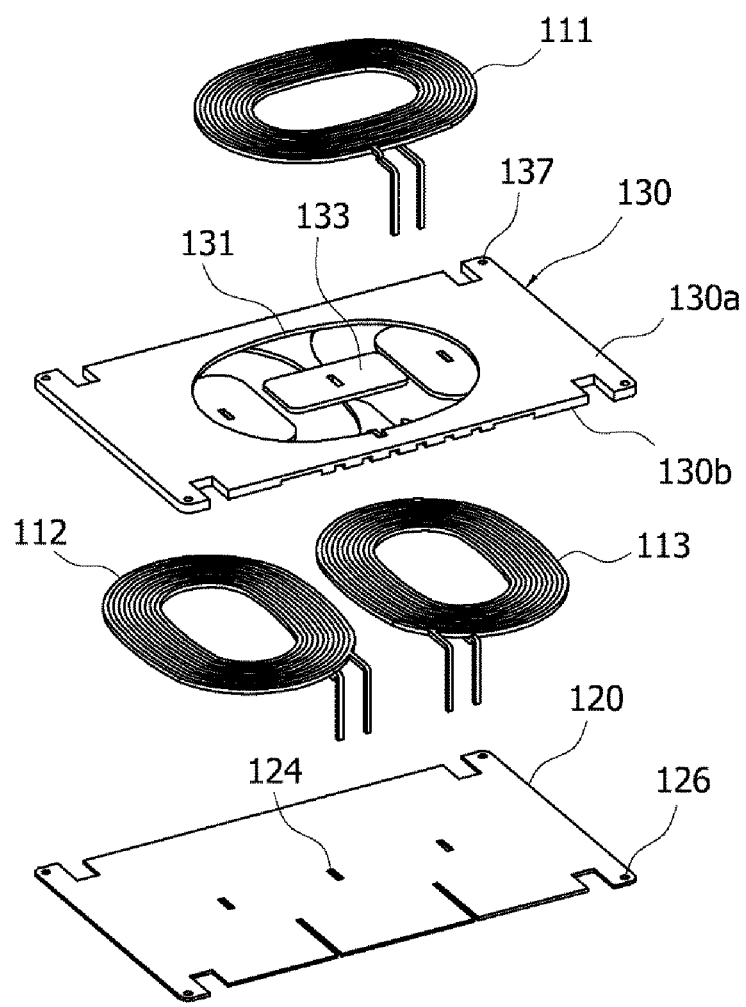
FIG. 8 is an exploded view of FIG. 7.
Figure 9:
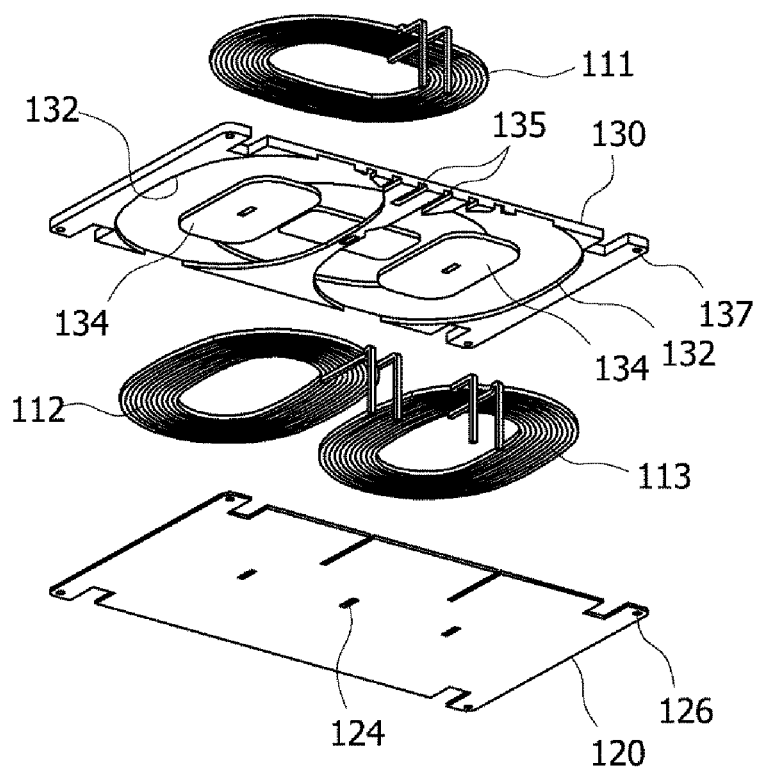
FIG. 9 is a view illustrating a state of FIG. 8 as seen from a bottom side.

To this end, as shown in FIG. 7, the supporting plate 130 may be formed of a plate-shaped member which includes a first surface 130*a* and a second surface 130*b* which are surfaces opposite to each other and has a predetermined area. Further, as shown in FIGS. 8 and 9, the supporting plate 130 may include a plurality of seating grooves 131 and 132 formed to be sunk by a predetermined depth in at least one of the first surface 130*a* and the second surface 130*b*.

Here, the plurality of seating grooves 131 and 132 may include a first seating groove 131 for receiving the first coil 111 disposed on an upper portion among the plurality of coils and two second seating grooves 132 for receiving the second coil 112 and the third coil 113 which are disposed on the same plane.

Figure 11:
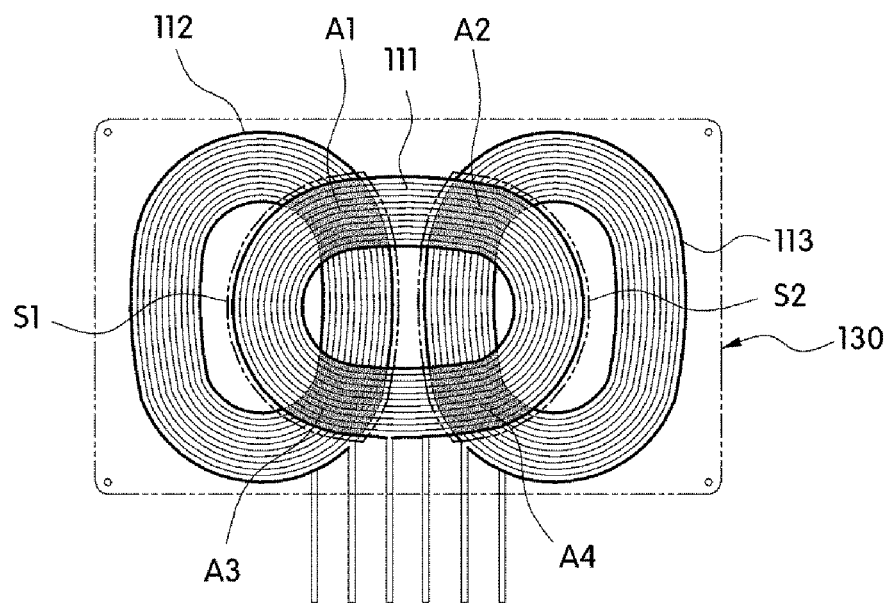
FIG. 11 is a conceptual view for describing an arrangement relationship between wireless power transmission antennas when the wireless power transmission antenna is provided in plural numbers in FIG. 7.
Figure 12:
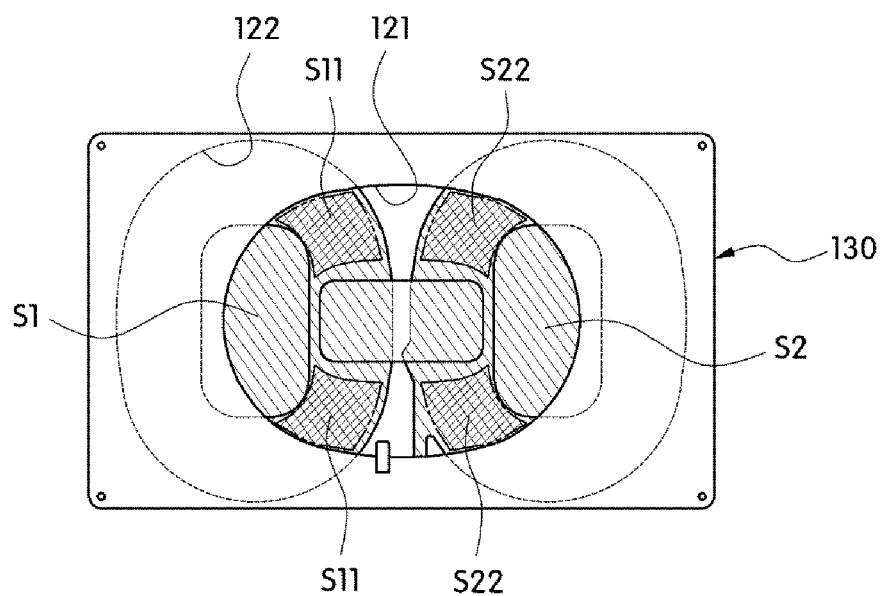
FIG. 12 is a conceptual view for describing overlapping regions between the wireless power transmission antennas and seating grooves in FIG. 11.

At this point, the first seating groove 131 and the second seating groove 132 may be formed on surfaces opposite to each other, respectively. That is, the first seating groove 131 may be formed on the first surface 130*a* of the supporting plate 130, and the second seating groove 132 may be formed on the second surface 130*b* of the supporting plate 130. Further, as shown in FIG. 11, the first seating groove 131 and the second seating groove 132 may be formed on the first surface 130a and the second surface 130b, respectively, to form overlapping regions S1 and S2 in which at least some areas overlap each other.

Accordingly, when a worker inserts the first coil 111 into the first seating groove 131 and inserts the second coil 112 and the third coil 113 into the second seating grooves 132, the first coil 111 may overlap the second coil 112 and the third coil 113 at positions corresponding to partial regions S11 and S12 of the overlapping regions S1 and S2.

Here, the partial regions of the overlapping regions S1 and S2 may be formed to pass through the supporting plate 130 so that a part of the first coil 111 which is disposed in the first seating groove 131 may be in direct contact with parts of the second coil 112 and the third coil 113 which are disposed in the second seating grooves 132.

Therefore, when the overlapping regions, which overlap each other, are formed to have positions and areas according to a required standard in the process of forming the first seating groove 131 and the second seating groove 132, the alignment between the coils may be simply completed without performing additional alignment work.

Further, protrusions 133 and 134, which protrude from the corresponding seating grooves 131 and 132, may be provided at central portions of the first seating groove 131 and the second seating groove 132 at positions corresponding to central empty spaces of the coils 111, 112, and 113.

For example, the protrusions may include a first protrusion 133 which protrudes at the central portion of the first seating groove 131 from a bottom surface of the first seating groove 131 with a predetermined height and a second protrusion 134 which protrudes at the central portion of the second seating groove 132 from a bottom surface of the second seating groove 132 with a predetermined height. Here, the first protrusion 133 and the second protrusion 134 may be formed to have the height which is the same as the depth of the corresponding seating grooves 131 and 132.

The protrusions 133 and 134 may be located in the central empty spaces of the coils 111, 112, and 113 and may be in contact with inner sides of the coils 111, 112, and 113 when the coils are inserted. Thus, the inner sides of the coils which are inserted into the corresponding seating grooves 131 and 132 may be supported by the protrusions 133 and 134, respectively, and outer sides thereof may be supported by inner walls of the seating grooves 131 and 132, respectively.

Therefore, even when a shake of the wireless power transmission device 100 or 200, for example, a shake while the vehicle is being driven, is generated, the position of each of the first coil 111, the second coil 112, and the third coil 113 may be fixed by the seating grooves 131 and 132, thereby preventing the movement of each of the coils 111, 112, and 113.

Here, the protrusions 133 and 134 may be provided to have areas corresponding to the central empty spaces of the coils. Accordingly, some areas of the protrusions 133 and 134 may be disposed in the overlapping regions S1 and S2 in which the first seating groove 131 and the second seating groove 132 overlap each other, and the remaining areas may be disposed in a region in which the first seating groove 131 and the second seating groove 132 do not overlap each other.

Therefore, some areas of the first protrusion 131 formed in the first seating groove 123, which are disposed in the overlapping regions S1 and S2, may be in direct contact with a part of the coils 112 and 113 disposed in the second seating grooves 132 to support the part of the coils 112 and 113 disposed in the second seating grooves 132, and some areas of the second protrusion 134 formed in the second seating groove 132, which are disposed in the overlapping regions S1 and S2, may be in direct contact with a part of the coil 111 disposed in the first seating groove 131 to support the part of the coil 111 disposed in the first seating groove 131.

In addition, all the remaining portions of one surface of each of the coils except the overlapping regions A1, A2, A3, and A4 may be in contact with the supporting plate 130. With this configuration, in a case in which a heat-dissipating function is added to the supporting plate 130, the contact area of the coils with the supporting plate 130 may be secured at maximum so that heat generated by the coils may be quickly dispersed by the supporting plate 130. Here, the heat-dissipating function of the supporting plate 130 will be described below.

Meanwhile, the first seating groove 131 and the second seating grooves 132 may be formed to have a depth which is the same as the thickness of the coils 111, 112, and 113, and the thickness of the supporting plate 130 may be the same as the sum of thicknesses of two coils 111 and 112 or 111 and 113 which overlap each other. For example, the maximum thickness of the supporting plate 130 may be the same as the sum of the thickness of the first coil 111 and the thickness of the second coil 112.

Accordingly, even though the wireless power transmission device 100 or 200 according to one embodiment of the present invention uses the supporting plate 130 for aligning the positions of the coils, the plurality of coils 111, 112, and 113 may be conveniently aligned without increasing the thickness of the wireless power transmission device 100 or 200.

In addition, since one surface of the supporting plate 130 including one surface of the coil forms a horizontal plane after the coils 111, 112, and 113 are received in the seating grooves 131 and 132 formed in the supporting plate 130, the contact area of the supporting plate 130 with the magnetic field shielding sheet 120 may be increased. Accordingly, even though the magnetic field shielding sheet 120 is manufactured in a form of a sheet which has flexibility or is made of a material having strong brittleness, one surface of the magnetic field shielding sheet 120 is supported by the supporting plate 130 so that the magnetic field shielding sheet 120 may be prevented from being damaged due to an external shock and disposed in a horizontal state.

Meanwhile, guide grooves 135 each configured to receive a connection terminal drawn out from each of the coil bodies may be formed on at least one surface of the supporting plate 130. The guide groove 135 may be formed to communicate with at least one seating groove of the first seating groove 131 and the second seating groove 132 so that the connection terminals of the coils which are received in the corresponding seating grooves may be appropriately disposed. For example, all the guide grooves 135 may be formed on the second surface 130b of the supporting plate 130, as shown in FIG. 9.

The guide groove 135 may be provided to have a height which is approximately the same as a wire diameter of a conductive member constituting the planar coils 111, 112, and 113 so that one surface of each of the first coil 111 and the second coil 112 may be completely in surface contact with one surface of the magnetic field shielding sheet 120 in a case in which the magnetic field shielding sheet 120 is disposed on one surface of the supporting plate 130.

Meanwhile, the supporting plate 130 applied to the present invention may further have a heat-dissipating function to quickly disperse the heat generated by the coils to solve a thermal issue in addition to the function of easily disposing the coils and fixing the position of the coils.

Figure 10:
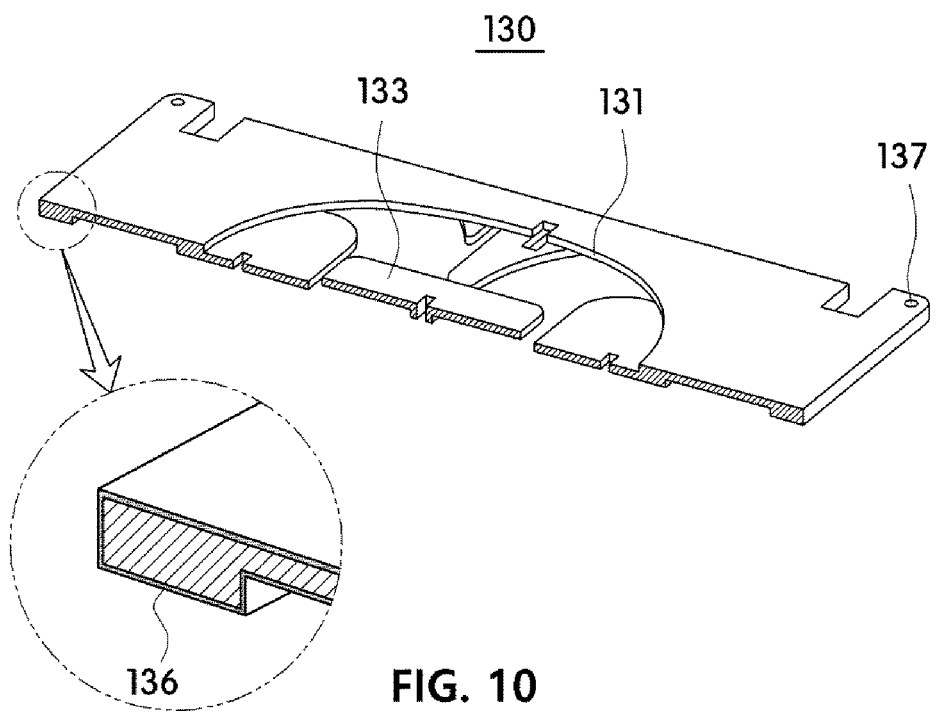
FIG. 10 is a view illustrating a cut state of the supporting plate in FIG. 7.

To this end, a coating layer 136 having a heat-dissipating property may be formed on an outer surface of the supporting plate 130, as shown in FIG. 10, the supporting plate 130 may be formed of a plastic material having a heat-dissipating property, or the coating layer 136 having a heat-dissipating property may be formed on the outer surface of the supporting plate 130 which is formed of a plastic material having a heat-dissipating property.

For example, the coating layer 136 may include a heat-conductive filler, such as a carbon-based filler, and graphene, carbon nanotube, borne nitride, or the like may be used as the heat-conductive filler.

In addition, as the plastic having a heat-dissipating property, composite plastic including planar graphite may be used. However, it should be noted that the material for the coating layer 136 and/or the heat-dissipating plastic for heat dissipation is not limited thereto, and all known coating materials and heat-dissipating plastic which are used for heat dissipation may be used.

Meanwhile, at least one fastening hole 137 may be formed to pass through the supporting plate 130 so as to be coupled to other members. A fastening member such as a bolt member may be coupled to or pass through the fastening hole 137.

Here, in a case in which the supporting plate 130 is made of a plastic material, a metal member (not shown) may be partially embedded in the supporting plate 130 to prevent the supporting plate 130 from being damaged when the supporting plate 130 is coupled to other components by the fastening member.

Accordingly, the fastening hole 137 is formed in the supporting plate 130 at a position corresponding to the metal member, thereby increasing fastening force and durability. Here, the metal member may be integrated with the supporting plate 130 through insert-molding.

Meanwhile, the wireless power transmission device 100 or 200 according to one embodiment of the present invention may further include a heat-dissipating member 140 to increase heat-dissipating performance.

Figure 13:
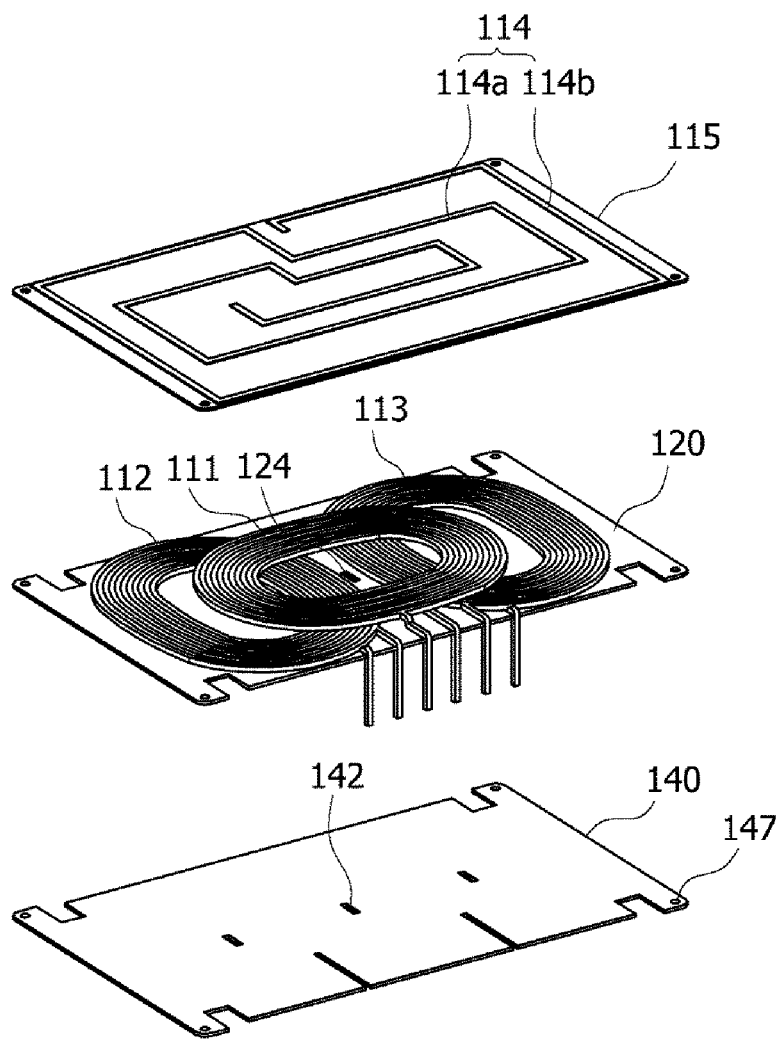
FIG. 13 is a view illustrating another type of wireless power transmission device to which a heat-dissipating member is applied in FIG. 1.
Figure 14:
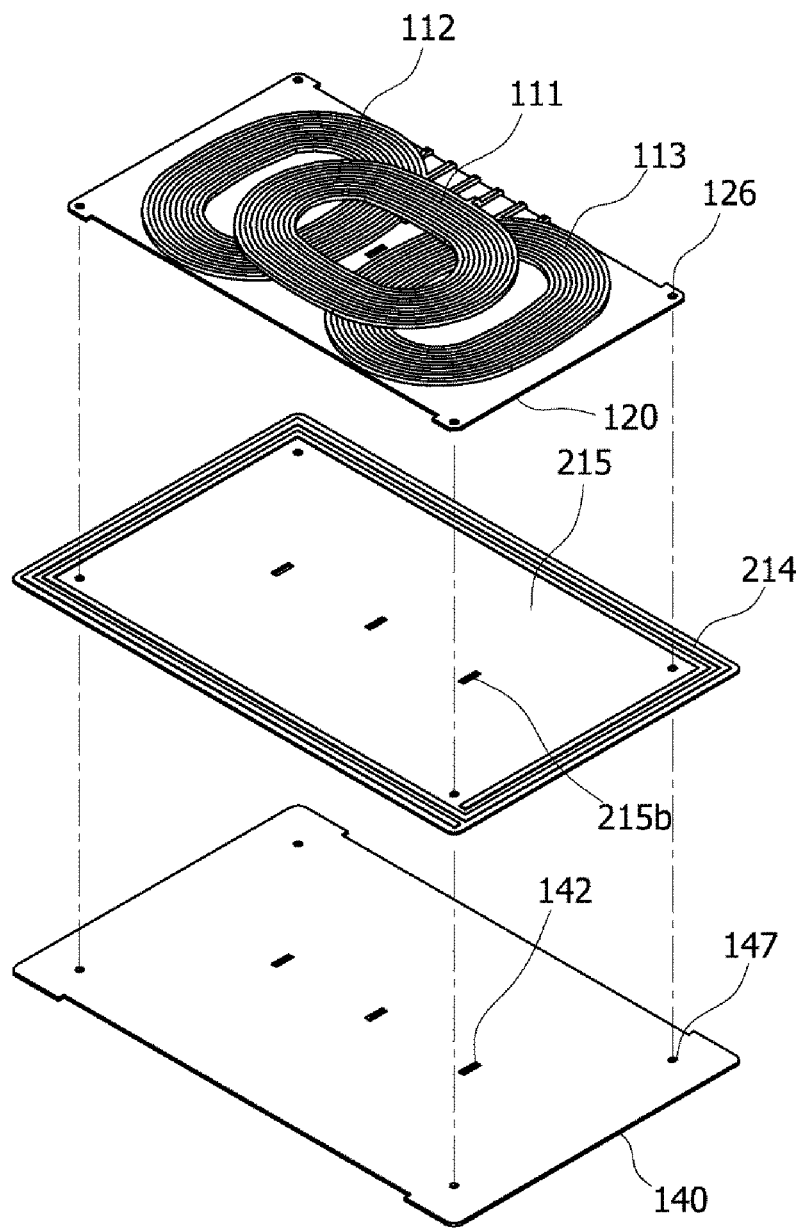
FIG. 14 is a view illustrating another type of wireless power transmission device to which a heat-dissipating member is applied in FIG. 4.
Figure 15:
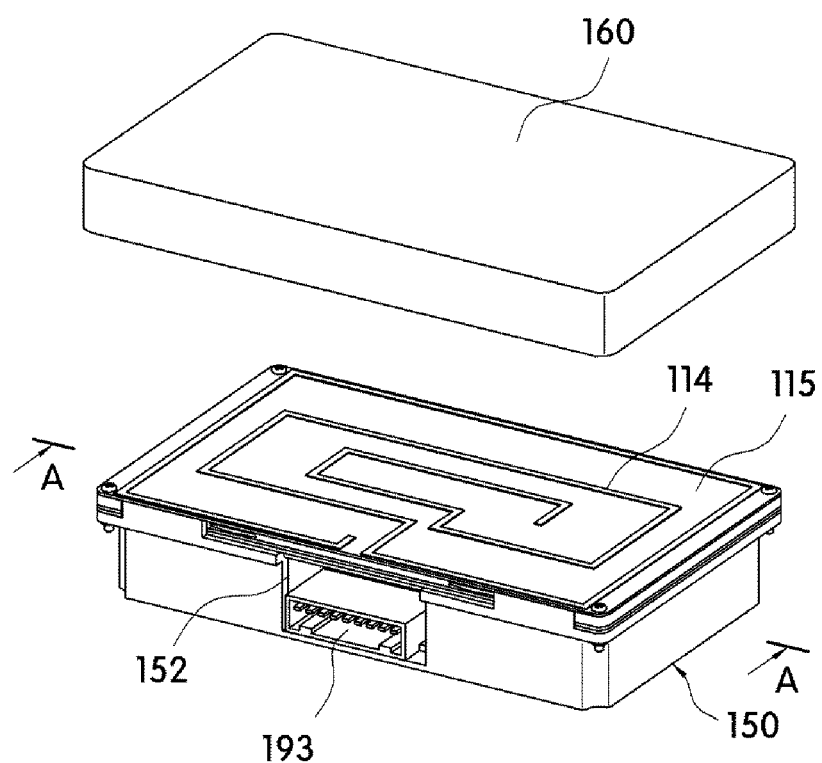
FIG. 15 is a view illustrating still another type of wireless power transmission device to which a heat-dissipating member and a housing are applied in FIG. 1.

That is, as shown in FIGS. 13 and 14, the heat-dissipating member 140 may be disposed on one surface of the magnetic field shielding sheet 120 or on one surface of the circuit board 215 to disperse the heat transmitted from a heat source or release the heat to the outside.

To this end, the heat-dissipating member 140 may be made of a material having excellent thermal conductivity. For example, the heat-dissipating member 140 may be formed of any one of copper, aluminum, and graphite, or a mixture of two or more thereof. In addition, the material of the heat-dissipating member 140 is not limited to those listed above and the heat-dissipating member 140 may be formed of a material having a thermal conductivity which is equal to or higher than 200 W/m·K.

Here, the heat-dissipating member 140 may be formed of a plate-shaped member having a predetermined area to quickly disperse heat generated by a heat source by increasing the contact area with the heat source.

The heat-dissipating member 140 may be a plate-shaped metal sheet which is made of a metal material such as a copper or aluminum material and has a predetermined thickness so as to serve as a support which supports the magnetic field shielding sheet 120 simultaneously in addition to the heat-dissipating function for dispersing or releasing heat generated by a heat source such as the wireless power transmission antennas 111, 112, and 113.

That is, even though the magnetic field shielding sheet 120 is formed of a weak sheet or a flexible sheet such as a ferrite sheet or a polymer sheet, the magnetic field shielding sheet 120 may be supported by the heat-dissipating member 140 which is formed of a metal material having a predetermined strength, and thus, when the wireless power transmission device according to one embodiment of the present invention is assembled with other components such as a case or a housing, an assembling property and a fastening property may be improved.

The heat-dissipating member 140 may be attached to one surface of the magnetic field shielding sheet 120 or one surface of the circuit board 215 through an adhesive layer (not shown) including a heat-conductive component and at least one assembling hole 147 through which a fastening member passes may be formed to pass through the heat-dissipating member 140. Here, a separate assembling hole 126 may be formed to pass through the magnetic field shielding sheet 120 in a position corresponding to the assembling hole 147.

Thus, the heat generated by the planar coils 111, 112, and 113 may be transmitted to the heat-dissipating member 140 through the magnetic field shielding sheet 120 or the circuit board 215 and then dispersed so that a temperature of air over the planar coils 111, 112, and 113 may be lowered.

As another example, as shown in FIG. 14, in a case in which the circuit board 215 on which the wireless communication antenna 214 is formed is disposed on the second surface of the magnetic field shielding sheet 120, and the heat-dissipating member 140 is disposed on a side opposite to the magnetic field shielding sheet 120 with the circuit board 215 as a boundary, the heat-dissipating member 140 may be a thin metal sheet having a very thin thickness. In this case, the thin metal sheet may be attached to one surface of the circuit board 215 through an adhesive layer or may be integrally formed on one surface of the circuit board 215.

Meanwhile, one or more through holes 124, 142, and 215*b* may be formed to pass through the magnetic field shielding sheet 120, the heat-dissipating member 140, and/or the circuit board 215, respectively, in regions corresponding to each other.

That is, at least one first through hole 124 may be formed to pass through the magnetic field shielding sheet 120, and a second through hole 142 may be formed in a position corresponding to the first through hole 124 to pass through the heat-dissipating member 140. Further, in a case in which the circuit board 215 is disposed on the second surface of the magnetic field shielding sheet 120, a third through hole 215*b* may be formed in a position corresponding to the first through hole 124 and the second through hole 142 to pass through the circuit board 215.

When a circuit board 191 is disposed on a bottom surface of the heat-dissipating member 140, the through holes 124, 142, and 215*b* serve as passages through which air around the planar coils 111, 112, and 113 may move toward the circuit board 191.

Here, a temperature sensor 194 such as a thermistor may be disposed on the circuit board 191 in a region corresponding to the second through hole 142, and in a case in which the temperature sensor 194 protrudes from the circuit board at a predetermined height, the second through hole 142 may simultaneously perform the role of an arrangement hole configured to receive the temperature sensor. In this case, the second through hole 142 may be provided to have a relatively wider area than that of the temperature sensor so that the temperature sensor may be not in contact with the heat-dissipating member 140.

Thus, air heat-exchanged with the heat generated by the planar coils 111, 112, and 113 when the wireless power transmission device operates may flow into the temperature sensor so that the temperature sensors detect the temperature of the heat generated by the planar coils 111, 112, and 113 and thus when it is detected that the temperature of the planar coils 111, 112, and 113 is equal to or higher than a predetermined value, an entire operation may be stopped, thereby preventing several problems such as damage of the electronic components due to overheating in advance.

At this point, the first through hole 124 may be formed in a region corresponding to the hollow portion of the planar coil constituting the wireless power transmission antennas 111, 112, and 113. The reason is that the first through hole 124 does not overlap the patterned portions of the planar coils so that the air around the planar coils smoothly flows toward the first through hole 124.

Meanwhile, the vehicle wireless power transmission device 100 or 200 according to the embodiment described above may further include a housing 150 or 250 and a cover 160 detachably coupled to the housing 150 or 250.

For example, as shown in FIGS. 15 to 19, the wireless power transmission device may have a form in which both the supporting plate 130 and the heat-dissipating member 140, which are described above, are applied and may be embedded in the vehicle such that one surface of the cover 160 is exposed to the outside.

Specifically, the housing 150 or 250 may be provided in a box shape having an accommodation space with an open upper portion, and one or more circuit boards 191 and 192 which are electrically connected to the wireless power transmission antennas 111, 112, and 113 and the wireless communication antenna 114 or 214 to control the overall operation may be accommodated in the accommodation space.

Further, the wireless power transmission antennas 111, 112, and 113 and the wireless communication antenna 114 or 214 may be arranged to be located on upper sides of the circuit boards 191 and 192 which are built-in the accommodation space by being fastened to the open upper side of the housing 150 or 250 by a fastening member 158.

Here, various circuit elements for controlling the overall operation of the wireless power transmission device may be mounted on the circuit boards 191 and 192, and driving chips for driving the wireless communication antenna 114 or 214 and the wireless power transmission antennas 111, 112, and 113 may be mounted on the circuit boards 191 and 192. In addition, the circuit elements may be provided as a plurality of elements, or integrated into one. In addition, a connector 193 for connection with an external power source may be mounted on at least one of the circuit boards 191 and 192, and the connector 193 may be exposed to the outside through an opening 152 formed on one side of the housing 150 or 250.

Even though the housing 150 or 250 may be formed of a conventional plastic material, the housing 150 or 250 may be formed of a material having an excellent thermal conductivity to release heat generated by a heat source to the outside when driving.

Figure 20:
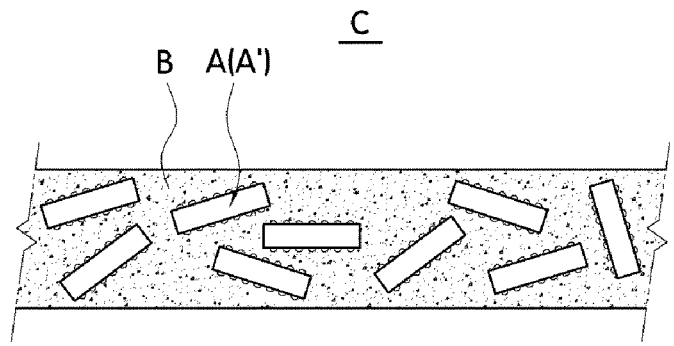

For example, the housing 150 or 250 may be formed of a metal material such as copper or aluminum, and a plastic material using a heat-dissipating member forming composition C including a graphite composite A or A' illustrated in FIG. 20. Alternatively, as shown in FIG. 22, the housing 150 or 250 may have a form in which a metal plate D and heat-dissipating plastic are integrated by insert-molding the heat-dissipating member forming composition C including the graphite composite A or A', and the planar metal plate D such as copper or aluminum.

Here, the heat-dissipating member 140 may be disposed such that at least a part of the heat-dissipating member 140 is in direct contact with the housing 150 or 250 when the heat-dissipating member 140 is coupled to the housing 150 or 250. For example, the heat-dissipating member 140 may be provided to have a relatively wider area than an upper edge of the housing 150 or 250 so that an edge of the heat-dissipating member 140 may be disposed to be in contact with the upper edge of the housing 150 or 250. With this configuration, the heat generated by the planar coils 111, 112, and 113 may be dispersed in the heat-dissipating member 140 and then directly transmitted to the housing 150 or 250. Accordingly, the heat transmitted to the housing 150 or 250 may be released to the outside, thereby further reducing the amount of heat transferred toward the cover 160.

In addition, an insulation member (not shown) having a plate shape may be disposed on one surface of the heat-dissipating member 140 to electrically isolate the heat-dissipating member 140 from the circuit board 191. For example, the insulation member may be formed of a fluororesin-based film such as PET.

Figure 22:
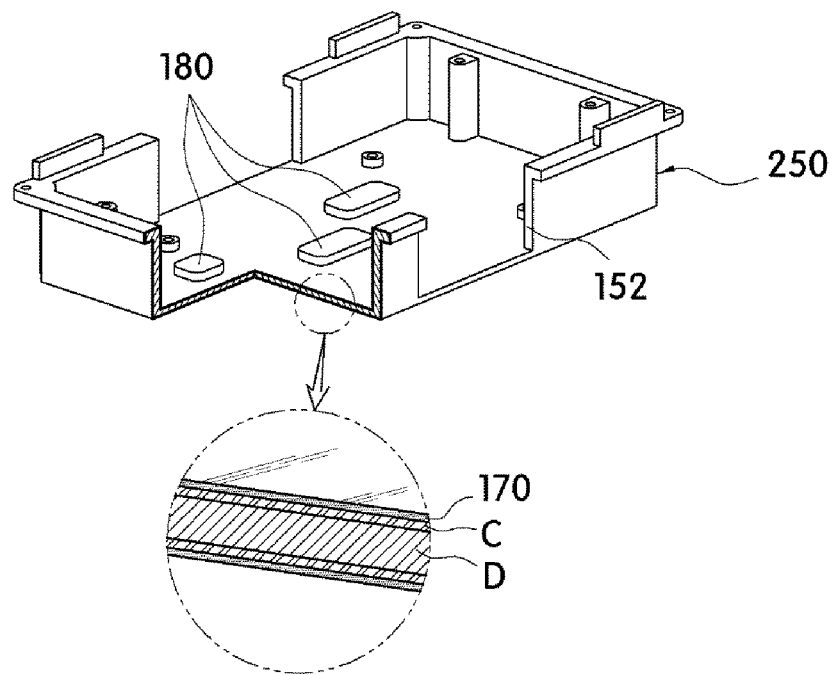
FIG. 22 is a partial cutaway view illustrating a case in which the housing applied to FIGS. 15 and 18 is realized in a state in which the heat-dissipating member forming composition and a metal plate are integrated.

Meanwhile, the housing 150 or 250 applied to the present invention may include a heat-dissipating coating layer 170 formed on a surface thereof so as to realize a more excellent heat-dissipating property as shown in FIG. 22.

With this configuration, the heat generated by the heat source may be released through the housing 150 or 250, thereby further lowering a surface temperature of the cover 160 on which an electronic device to be charged is placed.

That is, the surface temperature of the cover 160 may be further lowered by applying the heat-dissipating coating layer 170 to outer surfaces of the housing 150 or 250 with a predetermined thickness to further enhance the overall heat-dissipating property. Thus, the vehicle wireless power transmission device 100 or 200 according to one embodiment of the present invention may minimize the increase in the surface temperature of the cover 160 due to the heat generated by the heat source during operation. Accordingly, since in the vehicle wireless power transmission device 100 or 200 according to one embodiment of the present invention, the surface temperature of the cover 160 may be lowered, a user may feel less uncomfortable due to a high temperature even if a user's body is in contact with the cover 160.

To this end, even though the heat-dissipating coating layer 170 may be formed of any coating layer having a known heat-dissipating property, the heat-dissipating coating layer 170 may include a coating layer forming component, a carbon-based filler, and a physical property enhancing component for enhancing a heat-dissipating property and an adhesive property. Here, the carbon-based filler may be contained in an amount of 8 to 72 parts by weight based on 100 parts by weight of a main resin.

The coating layer forming component may include the main resin and may further include a curing agent when the main resin is a curable resin, and the coating layer forming component may further include other curing accelerators and curing catalysts.

Although any component known in the art which can form the coating layer may be used as the main resin without limitation, the main resin may include one or more epoxy resins selected from the group consisting of a glycidyl ether type epoxy resin, a glycidyl amine type epoxy resin, a glycidyl ester type epoxy resin, a linear aliphatic type epoxy resin, a rubber modified epoxy resin, and derivatives thereof.

This is to simultaneously achieve an enhancement in adhesion with the housing 150 or 250, an enhancement in heat resistance which is not weakened by heat, an enhancement in mechanical strength, and an enhancement in heat-dissipating performance due to improvement in compatibility with a carbon-based filler.

Specifically, the glycidyl ether type epoxy resin may include a glycidyl ether of a phenol and a glycidyl ether of an alcohol, and the glycidyl ether of a phenol may include one kind or more selected from a bisphenol-based epoxy such as bisphenol A type, bisphenol B type, bisphenol AD type, bisphenol S type, bisphenol F type, and resorcinol, a phenol-based novolak such as phenol novolak epoxy, aralkyl phenol novolac, and terpene phenol novolak, and a cresol novolak-based epoxy resin such as o-cresol novolac epoxy.

Here, the main resin may be a glycidyl ether type epoxy resin including a bisphenol A type epoxy resin, which is excellent in compatibility with carbon-based fillers, especially carbon black among them, to enhance heat-dissipating properties, durability, and surface quality.

Here, the bisphenol A type epoxy resin may have an epoxy equivalent of 350 to 600 g/eq. This is because when the epoxy equivalent is less than 350 g/eq, the hardness of the heat-dissipating coating layer 170 may increase so that the heat-dissipating coating layer 170 may be easily broken or cracked or peeling may easily occur in a curved surface to be coated, and when the epoxy equivalent exceeds 600 g/eq, chemical resistance, adhesion, and durability may be deteriorated due to occurrence of uncured portions.

Further, the bisphenol A type epoxy resin may have a viscosity of 10 to 200 cps. This is because when the viscosity of the bisphenol A type epoxy resin is less than 10 cps, the heat-dissipating coating layer 170 may be difficult to form, and the adhesion between the heat-dissipating coating layer 170 and the surfaces of the housing 150 or 250 may be lowered even after the formation of the heat-dissipating coating layer 170. On the other hand, when the viscosity of the bisphenol A type epoxy resin exceeds 200 cps, it is difficult to form the heat-dissipating coating layer 170 to have a thin thickness, and the coating process may not be easy, and the coating process may be more difficult especially in the case of spray-based coating. In addition, the dispersibility of carbon black in the heat-dissipating coating layer 170 may be deteriorated.

Meanwhile, the type of the curing agent contained in the coating layer forming component together with the epoxy resin which is the main resin may be varied depending on the specific type of the epoxy resin selected, and specific examples of the type of the curing agent may include those known in the art, and preferably, one or more components among an acid anhydride-based component, an amine-based component, an imidazole-based component, a polyamide-based component, and a polymercaptan-based component.

Further, when the main resin includes a bisphenol A type epoxy resin, the coating layer forming component may further include a polyimide-based component as a curing agent. This is because it is very advantageous for enhancing the compatibility with carbon-based fillers, to be described later, particularly carbon black among them, and it is advantageous in all physical properties such as adhesive property, durability, and surface quality of the heat-dissipating coating layer 170. In addition, this is for preventing cracks or peeling from occurring in the heat-dissipating coating layer 170 formed in curved or stepped portions of the housing 150 or 250 when the outer surfaces of the housing 150 or 250 to which the heat-dissipating coating layer 170 is applied are curved or stepped rather than a flat plane.

Here, in order to exhibit further enhanced physical properties, the polyamide-based component may have an amine value of 180 to 300 mgKOH/g, and preferably, a viscosity of 50,000 to 70,000 cps at 40° C. This is because when the amine value of the polyamide-based curing agent is less than 180 mgKOH/g, curing quality is deteriorated so that all surface quality, durability, and adhesive property may be deteriorated, and heat-dissipating performance may also be deteriorated simultaneously. In addition, when the amine value exceeds 300 mgKOH/g, curing may proceed rapidly so that an agglomeration phenomenon may occur during coating. Further, when the viscosity of the polyamide-based curing agent is less than 50,000 cps, the coating may flow down after coating, and when the viscosity of the polyamide-based curing agent exceeds 70,000 cps, the application may not be performed uniformly during spray coating, or the nozzle may be clogged and aggregated.

Further, in a case in which the main resin contained in the coating layer forming component is a bisphenol A type epoxy resin, the polyamide-based curing agent may be contained in an amount of 45 to 75 parts by weight based on 100 parts by weight of the bisphenol A type epoxy resin. This is because when the amount of the polyamide-based curing agent is contained less than 45 parts by weight, problems such as non-curing and durability deterioration may occur, and when the amount of the polyamide-based curing agent is contained greater than 75 parts by weight, a breakage phenomenon or the like due to excessive curing may occur.

Any carbon-based material may be used as the carbon-based filler without limitation as long as it includes carbon, and carbon-based materials known in the art may be used. In addition, the carbon-based filler is not limited in shape and size and may have a porous structure or non-porous structure, which may be selected depending on the purpose and is not particularly limited in the present invention. For example, the carbon-based filler may include one kind or more selected from the group consisting of carbon nanotubes such as a single-walled carbon nanotube, a double-walled carbon nanotube, and a multi-walled carbon nanotube, graphene, graphene oxide, graphite, carbon black, and a carbon-metal complex. However, preferably, the carbon-based filler may include at least one of graphite and carbon black in terms of achieving desired physical properties such as excellent heat-dissipating performance, ease of formation of the coating layer, and improved surface quality of the coating layer and may include carbon black in terms of improving the surface quality of the coating layer.

As the carbon black, at least one kind of known carbon black such as furnace black, lamp black, and channel black may be selected and used without limitation. However, the carbon black may preferably have an average particle diameter of 250 nm or less, and more preferably, 50 to 250 nm. This is because when the average particle diameter of the carbon black exceeds 250 nm, the uniformity of the surface may be deteriorated, and when the average particle diameter is less than 50 nm, the product unit price may be increased. In addition, when the average particle diameter of the carbon black exceeds 250 nm, the amount of carbon black peeled off from the surface increases to deteriorate the heat-dissipating performance after the coating layer is implemented.

In addition, in order to improve the surface quality of the heat-dissipating coating layer 170, the carbon black may have a D90 of 260 nm or less in volume cumulative particle size distribution. This is because when the D90 exceeds 260 nm in the volume cumulative particle size distribution of the carbon black, the surface quality of the heat-dissipating coating layer 170 may be particularly deteriorated, for example, the surface roughness of the coating layer of the heat-dissipating coating layer 170 is increased.

Here, the D90 refers to a particle diameter of the carbon black particles when an accumulation degree in the volume cumulative particle size distribution is 120%. Specifically, in a graph (particle diameter distribution based on volume) that takes the volume cumulative frequency from the side having the smallest particle diameter on the vertical axis relative to the particle diameter on horizontal axis, for the volume cumulative value (100%) of the whole particles, a particle diameter of a particle corresponding to the cumulative value having 90% of the cumulative volume % from the smallest particle diameter corresponds to D90. The volume cumulative particle size distribution of the carbon black may be measured using a laser diffraction scattering particle size distribution measuring apparatus.

Further, as the carbon-based filler, a carbon-based filler obtained by modifying the surface with a functional group such as a silane group, an amino group, an amine group, a hydroxyl group, or a carboxyl group may be used, and at this point, the functional group may be directly bonded to the surface of the carbon-based filler or may be indirectly bonded to a carbon-based filler through a substituted or unsubstituted aliphatic hydrocarbon having 1 to 20 carbon atoms or a substituted or unsubstituted aromatic hydrocarbon having 6 to 14 carbon atoms as mediation.

In addition, it may be a core-shell type filler that the carbon-based material is used as a core or a shell, and the heterogeneous material constitutes the shell or the core.

In order to exhibit further enhanced physical properties, the carbon-based filler may be contained in an amount of 8 to 72 parts by weight based on above-described 100 parts by weight of the main resin, and preferably, 17 to 42 parts by weight.

This is because when the carbon-based filler is contained in an amount of less than 8 parts by weight based on 100 parts by weight of the main resin, the desired level of heat-dissipating performance may not be exhibited. In addition, when the carbon-based filler exceeds 72 parts by weight based on 100 parts by weight of the main resin, the adhesion of the heat-dissipating coating layer 170 is weakened and peeling easily occurs, and the hardness of the coating layer becomes large so that it may be easily broken or crushed by a physical impact, and as the number of carbon-based fillers protruding on the surface of the heat-dissipating coating layer 170 increases, the surface roughness may increase, and the surface quality of the heat-dissipating coating layer 170 may be deteriorated.

Meanwhile, preferably, the carbon-based filler may be contained in an amount of 42 parts by weight or less based on 100 parts by weight of the main resin. This is because when the carbon-based filler is used in an amount of greater than 42 parts by weight based on 100 parts by weight of the main resin, in the process of applying the heat-dissipating coating layer to the housing 150 or 250 in order to realize the heat-dissipating coating layer 170 with a thin thickness, it is difficult for a composition to be uniformly applied to the housing 150 or 250 when coating by some coating methods, for example, spraying, and since there is a possibility that the dispersibility of the carbon-based filler dispersed in the composition is deteriorated, even though the composition is applied to the housing 150 or 250, the carbon-based filler may be non-uniformly dispersed, and therefore, it may be difficult to exhibit a uniform heat-dissipating performance over the entire surface of the heat-dissipating coating layer 170.

The physical property enhancing component causes a more enhanced heat-dissipating property to be exhibited when a heat-dissipating coating composition according to the present invention is coated on the housing 150 or 250 and simultaneously causes an excellent adhesive property to be exhibited, thereby improving durability.

To this end, the physical property enhancing component may be a silane-based compound, and the known silane-based compounds employed in the art may be used without limitation. However, when used together with carbon black among the carbon-based filler and the main resin of the above-described coating layer forming component, in order to exhibit a remarkable durability and heat-dissipating property by causing a synergistic action of desired physical properties, the silane-based compound may include one or more selected from the group consisting of 3-(N-anil-N-glycidyl)aminopropyltrimethoxysilane, 3-glycidoxypropylmethylethoxysilane, γ-glycidoxytrimethyldimethoxysilane, 3-glycidoxypropyltrimethoxysilane, 3-glycidoxypropyltriethoxysilane, 3-glycidoxypropylmethylmethoxysilane, and 3-glycidoxypropylmethyldimethoxysilane.

In addition, the physical property enhancing component may be contained in an amount of 2 to 5 parts by weight based on 100 parts by weight of the main resin. This is because when the physical property enhancing component is contained in an amount of less than 2 parts by weight based on 100 parts by weight of the main resin, desired physical properties such as heat-dissipating property improvement and adhesive property improvement through the physical property enhancing component may not be achieved to the desired level, and when the physical property enhancing component is contained in an amount of greater than 5 parts by weight based on 100 parts by weight of the main resin, the adhesion with the surfaces of the housing 150 or 250 may be weakened.

Meanwhile, the heat-dissipating coating layer 170 may further include a dispersant and a solvent for improving the dispersibility of the carbon-based filler. As the dispersant, a known component employed in the art as a dispersant for a carbon-based filler may be used.

In addition, the heat-dissipating coating layer 170 may contain one kind or two kinds or more of various additives such as a leveling agent, a pH adjusting agent, an ion trapping agent, a viscosity modifier, a thixotropic agent, an antioxidant, a heat stabilizer, a light stabilizer, an ultraviolet absorber, a coloring agent, a dehydrating agent, a flame retardant, an antistatic agent, an antifungal agent, a preservative, and the like. The various additives described above may be those well known in the art and are not particularly limited in the present invention.

The above-described heat-dissipating coating layer 170 may have a viscosity of 50 to 250 cps at 25° C. This is because when the viscosity of the heat-dissipating coating layer 170 is less than 50 cps, the formation of the heat-dissipating coating layer 170 may be difficult due to flowing down of the composition from the surface to be coated during the coating process, and the adhesion to the surface to be coated may be weakened even after the formation, and when the viscosity of the heat-dissipating coating layer 170 exceeds 250 cps, it is difficult to manufacture a thin coating layer, the surface may not be uniform even when it is manufactured, the coating process may not be easy, and in particular, the coating process may be more difficult in the case of spray coating. In addition, when the viscosity of the heat-dissipating coating layer 170 exceeds 250 cps, the dispersibility of carbon black in the heat-dissipating coating layer may be deteriorated.

In addition, the heat-dissipating coating layer 170 may include 5 to 30% by weight of a carbon-based filler based on the total weight of the heat-dissipating coating layer. This is because when the carbon-based filler is contained in an amount of less than 5% by weight in the heat-dissipating coating layer 170, the desired level of heat-dissipating performance may not be exhibited. In addition, when the carbon-based filler is contained in an amount of greater than 30% by weight in the heat-dissipating coating layer 170, the adhesion of the heat-dissipating coating layer 170 is weakened and peeling easily occurs, and the hardness of the coating layer increases and the coating layer may easily be broken or crushed by a physical impact. In addition, when the carbon-based filler is contained in an amount of greater than 30% by weight in the heat-dissipating coating layer 170, as the number of carbon-based fillers protruded on the surface of the heat-dissipating coating layer 170 increases, the surface roughness may increase, and the surface quality of the heat-dissipating coating layer may be deteriorated.

Meanwhile, in a case in which the housing 150 or 250 applicable to the present invention is made of a plastic material using the heat-dissipating member forming composition C, the heat-dissipating member forming composition C may include the graphite composite A or A' and a polymer resin B as shown in FIG. 20 and may be realized in the form of the housing 150 or 250 through insert injection molding and then curing.

That is, the housing 150 or 250 may have significantly improved thermal conductivity by including the heat-dissipating member forming composition containing the graphite having high thermal conductivity, thereby realizing excellent heat-dissipating performance.

Figure 21A:
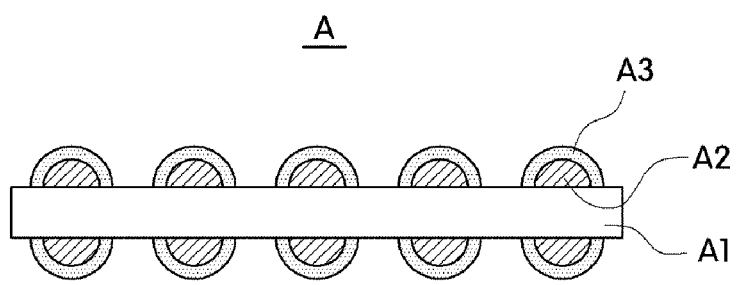
FIG. 21A is a view illustrating a case in which the graphite composite is formed of graphite, a nano-metal, and a catecholamine.
Figure 21B:
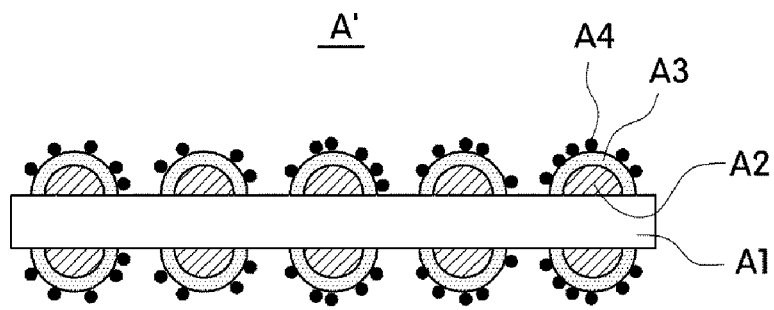
FIG. 21B is a view illustrating a case in which the graphite composite is formed of graphite, a nano-metal, a catecholamine, and a polymer.

Here, as shown in FIGS. 21A and 21B, the graphite composite A or A' may be formed of a composite in which nano metal particles A2 are bonded to a surface of graphite A1 having a plate shape, and the nano metal particles A2 may be formed of a conductive metal so as to exhibit an electromagnetic wave shielding effect. For example, the nano metal particles A2 may include one kind or more selected from the group consisting of Ni, Si, Ti, Cr, Mn, Fe, Co, Cu, Sn, In, Pt, Au, and Mg.

Here, since the nano metal particles A2 contained in the graphite composite A or A' must be present at a high density on the surface of the graphite A1 having a plate shape, the nano metal particles A2 may be contained in an amount of 20 to 50 wt. % based on the total weight of the graphite A1 and may be bonded to the surface of the graphite A1 in the form of crystals having an average particle diameter of 10 to 200 nm. In addition, the nano metal particles A2 may have a surface area range of 30 to 70 area % with respect to the cross section of the graphite composite A or A'.

Here, in the heat-dissipating member forming composition, as shown in FIG. 20, the graphite composite A or A' may form a dispersed phase in the polymer resin B. Here, the polymer resin B may include at least one of a thermosetting resin and a thermoplastic resin.

To this end, the graphite composite A or A' may include a catecholamine layer A3 on the nano metal particle A2 as shown in FIGS. 21A and 21B. This is because it is possible to enhance the strong interfacial bonding with the polymer resin using the strong adhesive property of catecholamine without deteriorating the inherent physical properties of planar graphite itself by coating the planar graphite A1 in which the nano metal particles A2 are crystallized on the surface thereof with catecholamine such as polydodamine to modify the surface of the planar graphite A1.

In addition, in a case in which the catecholamine layer A3 is coated on the nano metal particles A2, dispersibility is improved in an organic solvent, and thus, when the heat-dissipating member forming composition C contains an organic solvent, the graphite composite A or A' may be uniformly dispersed in the polymer resin B.

Accordingly, a composite material in which the dispersibility in the desired polymer resin is remarkably improved may be produced by preferentially producing the graphite composite A or A' including graphite-nano metal particles-catecholamines.

The term "catecholamine" as used herein means a single molecule having a hydroxyl group (—OH) as an ortho group of a benzene ring and various alkylamines as a para group, and various derivatives of these structures such as dopamine, dopamine-quinone, alpha-methyldopamine, norepinephrine, epinephrine, alphamethyldopa, droxidopa, indolamine, serotonin, and 5-hydroxydopamine may be included in the catecholamines. Most preferably, the dopamine may be used.

Generally, the catecholamine layer is hard to coat on a surface of pure planar graphite, but, the crystallized nano metal particles A2 are bonded at high density to the surface of the graphite composite A or A' applied to the present invention, and thus, the catecholamine layer A3 may be stably formed by bonding a catecholamine compound such as polydodamine to the crystallized nano metal particles A2.

In a case in which the catecholamine layer is composed of dopamine, the catecholamine layer may be formed by dipping the graphite composite A or A' in a dopamine aqueous solution. At this point, when a basic dopamine aqueous solution is used as the dopamine aqueous solution, dopamine reacts spontaneously under oxidizing conditions to be polymerized on the nano metal particles A2 of the graphite composite A or A', thereby forming a polydopamine layer. Therefore, a separate sintering process is not required, and the addition of an oxidizing agent is not particularly limited, but oxygen gas in the air may be used as the oxidizing agent without adding the oxidizing agent.

As described above, since the graphite composite A or A' applied to the present invention is in a state in which the nano metal particles A2 are bonded to the surface of the graphite, the catecholamine layer may be formed by the nano metal particles A2.

Accordingly, the interfacial characteristics between the polymer resin B and the graphite composite A or A' are enhanced through the catecholamine layer, thereby improving the orientation and dispersibility of the graphite composite A or A'. Therefore, since the content of the graphite composite included in the heat-dissipating member forming composition may be increased, it is possible to produce the composition in the form of a sheet even if a small amount of the polymer resin is included in the heat-dissipating member forming composition.

Meanwhile, the graphite composite A' may include a polymer A4 bonded on the catecholamine layer A3 (see FIG. 21B). For example, the graphite composite A in which the nano metal particles A2 are coated with the catecholamine may be added to the polymer resin solution to bind the polymer A4 on the catecholamine layer.

Here, the polymer A4 may be formed so as to completely cover the catecholamine layer A3 or may be bonded to the catecholamine layer A3 in the form of particles or may be formed so as to completely cover the graphite composite A.

In addition, the polymer A4 is not particularly limited in its kind, but may be selected from the group consisting of a thermosetting resin, a thermoplastic resin, and rubber. Here, although the kind of the polymer A4 is not particularly limited as long as it has reactivity and compatibility with the polymer resin B constituting the heat-dissipating member forming composition, preferably, a polymer of the same kind as that of the polymer resin B may be used as the polymer A4.

Thus, when the graphite composite A' including the graphite A1, the nano metal particles A2, the catecholamine layer A3, and the polymer A4 is first prepared and then dispersed in the desired polymer resin B, the graphite composite A' may be dispersed in the polymer resin B very uniformly and evenly.

That is, since the graphite composite A' includes the polymer A4 on the surface thereof, not only low dispersibility and an aggregation phenomenon of the graphite itself but also an aggregation phenomenon due to the high adhesion of the catecholamine layer itself does not occur. Accordingly, the graphite composite A' may be uniformly dispersed in the polymer resin. As a result, since the total content of the graphite composite A' may be increased in constituting the heat-dissipating member forming composition, excellent heat-dissipating performance may be obtained.

Meanwhile, in addition to the organic solvent, the above-described heat-dissipating member forming composition may contain one kind or two kinds or more of various additives such as a leveling agent, a pH adjusting agent, an ion trapping agent, a viscosity modifier, a thixotropic agent, antioxidant, a heat stabilizer, a light stabilizer, a ultraviolet absorber, a coloring agent, a dehydrating agent, a flame retardant, an antistatic agent, an antifungal agent, a preservative, and the like. The various additives described above may be those well known in the art and are not particularly limited in the present invention. Further, the catecholamine layer A3 may further include a solvent, and a suitable solvent may be selected according to the selected adhesive component, and therefore, the present invention is not particularly limited thereto, and any solvent capable of appropriately dissolving each component may be used as the solvent.

When the housing 150 or 250 applied to the present invention is realized as the heat-dissipating member forming composition obtained by mixing the graphite composite A or A' and the polymer resin B, the housing 150 or 250 may be realized using only the heat-dissipating member forming composition through injection molding, and alternatively, the housing 150 or 250 may be realized by integrating the heat-dissipating member forming composition with the metal plate D by covering the metal plate D through insert injection. Thus, the heat-dissipating performance may be enhanced even when the housing 150 or 250 having the same size are realized as compared with the case in which the housing 150 or 250 is realized by the metal material only. In addition, by enhancing the heat-dissipating performance as described above, the thickness of the housing may be reduced, thereby reducing the weight thereof.

Figure 16:
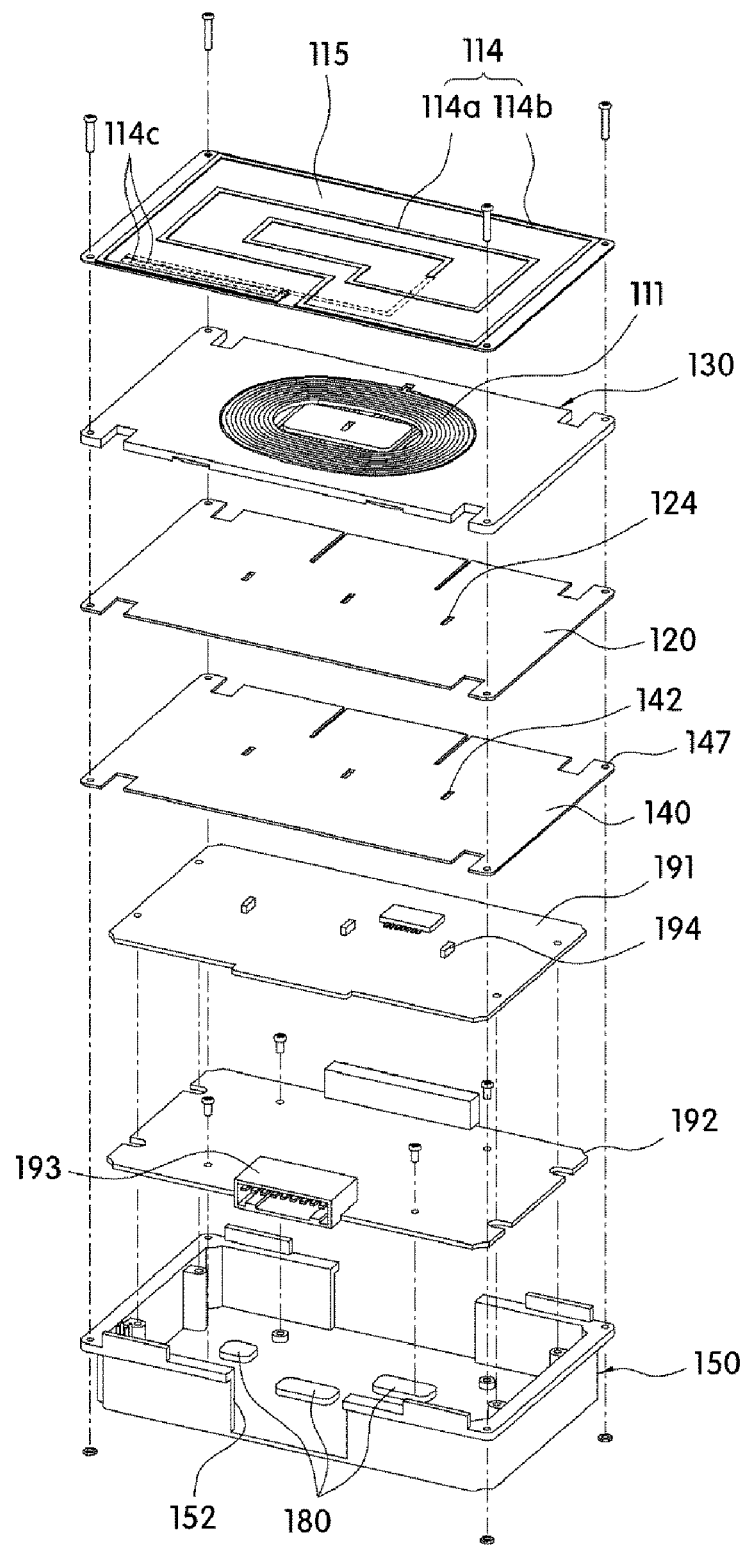
FIG. 16 is an exploded view of FIG. 15.
Figure 17:
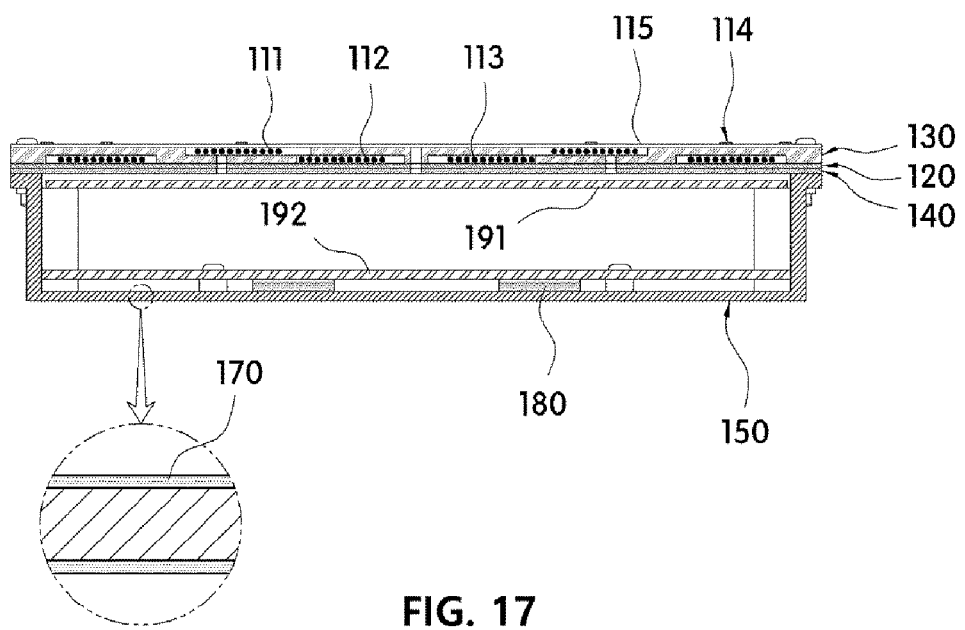
FIG. 17 is a cross-sectional view taken along line A-A in FIG. 15.
Figure 18:
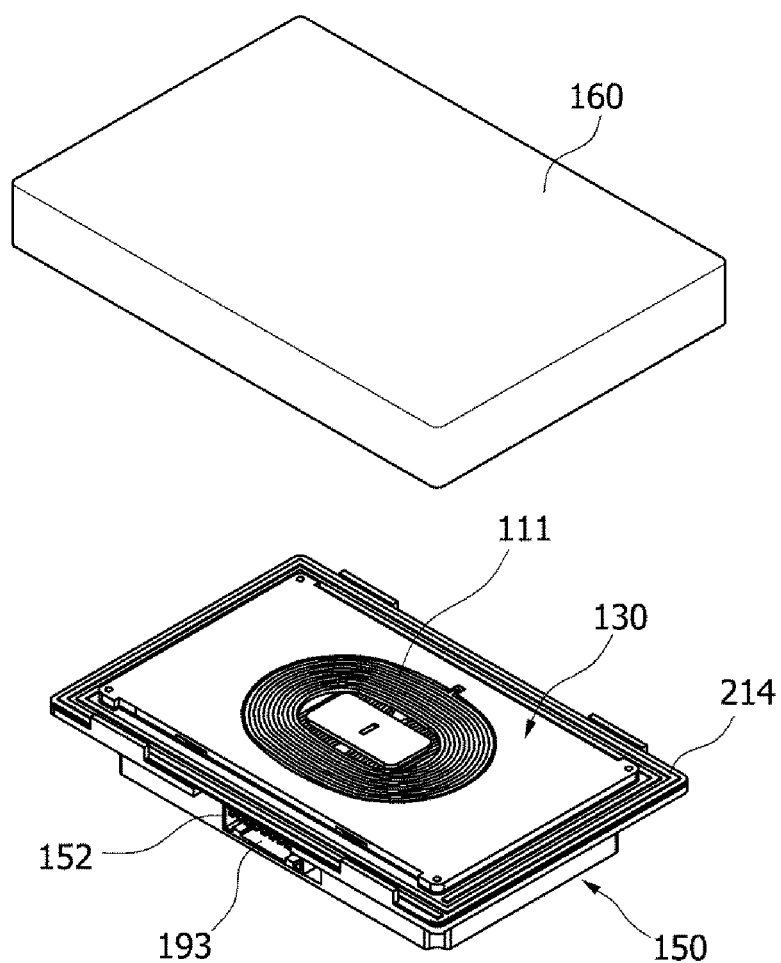
FIG. 18 is a view illustrating still another type of wireless power transmission device to which a heat-dissipating member and a housing are applied in FIG. 4.
Figure 19:
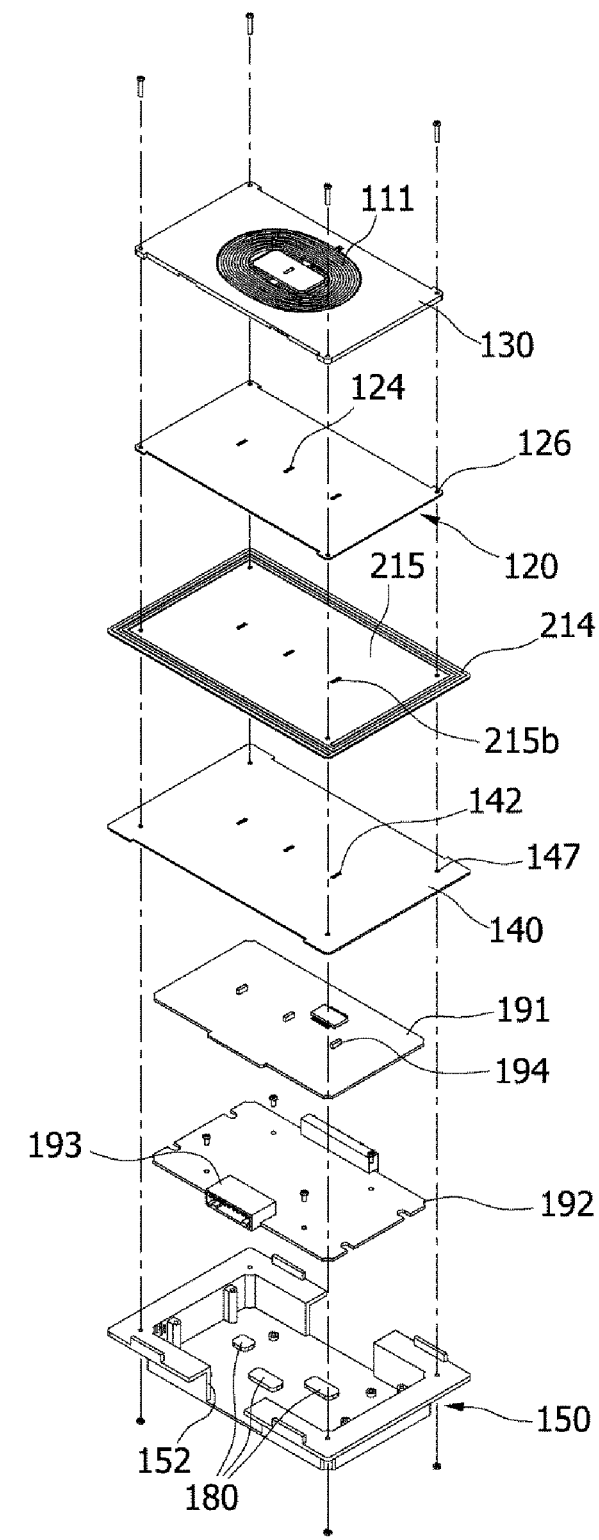
FIG. 19 is an exploded view of FIG. 18.

Meanwhile, the vehicle wireless power transmission device 100 or 200 according to the present invention may include a heat transfer member 180 disposed on a bottom surface of the housing 150 or 250 as shown in FIGS. 16, 19, and 22.

Since the heat transfer member 180 is disposed to be in contact with the bottom surface of the housing 150 or 250 and one surface of the circuit board 192 disposed inside the housing 150 or 250, heat generated by the circuit board 192 may be transferred to the housing 150 or 250.

For example, the heat transfer member 180 may be disposed in a region corresponding to heat generating devices such as an integrated circuit (IC) chip mounted on the circuit board 192, thereby transferring heat generated by the heat generating devices to the housing 150 or 250.

At this point, the heat transfer member 180 may have a thermal conductivity of 0.8 W/m·K or more. This is because when the thermal conductivity of the heat transfer member 180 is less than 0.8 W/m·K, a heat-dissipating effect is insignificant, resulting in deterioration of the wireless charging efficiency.

The heat transfer member 180 may be formed in a pad shape in which a heat-dissipating forming composition including at least one of a heat-conductive filler and a phase change material is solidified or may be formed by directly applying a heat-dissipating forming composition including at least one of a phase change material and a heat-conductive filler to the bottom surface of the housing 150 or 250 to a predetermined thickness and solidifying the same.

Here, when the heat transfer member 180 is formed of a heat-dissipating forming composition including a heat-conductive filler, the heat-conductive filler may include one kind or more of a metal filler, a ceramic filler, and a carbon-based filler.

At this point, the metal filler may include one kind or more of known metal fillers such as A1, Ag, Cu, NI, an In—Bi—Sn alloy, a Sn—In—Zn alloy, a Sn—In—Ag alloy, a Sn—Ag—Bi alloy a Sn—Bi—Cu—Ag alloy, a Sn—Ag—Cu—Sb alloy, a Sn—Ag—Cu alloy, a Sn—Ag alloy, and a Sn—Ag—Cu—Zn alloy, the ceramic filler may include one kind or more of known ceramic fillers such as AN, Al2O3, BN, SiC, and BeO, and the carbon-based filler may include one kind or more of known carbon-based fillers such as graphite, carbon nanotube, carbon fiber, diamond, and graphene.

Further, when the heat transfer member 180 is formed of the heat-dissipating forming composition including a heat-conductive filler, the heat transfer member 180 may further include a coating layer forming component and a curable component which are conventionally and generally used.

Meanwhile, when the heat-dissipating forming composition constituting the heat transfer member 180 includes a phase change material, the heat transfer member 180 may utilize a change in phase in which the phase changes from a solid phase to a semi-solid phase or a liquid phase due to the heat generated by the heat generating devices.

In other words, the heat absorbing or releasing when a certain material undergoes a phase change, for example, when changing from solid to liquid (or liquid to solid) or from liquid to gas (or gas to liquid), is called latent heat, and the latent heat is much larger than the heat absorbed (or released) according to the temperature change in the state in which the phase change does not occur, and thus it may be advantageous to achieve a remarkable heat-dissipating effect when the latent heat is utilized.

Here, the above-described phase change material may be a known phase change material. For example, the phase change material may include one kind or more selected from the group consisting of a linear aliphatic hydrocarbon, a hydrated inorganic salt, a polyhydric alcohol, a higher fatty acid, an alcohol fatty acid ester, and a polyether.

As described above, in the vehicle wireless power transmission device 100 or 200 according to the present invention, the surface temperature of an exposed surface of the cover 160 may be further reduced by forming the heat-dissipating coating layer 170 on the outer surfaces of the housing 150 or 250 and disposing the heat-dissipating member 140 made of a metal material on one surface of the magnetic field shielding sheet 120.

This may be confirmed in Table 1 below.

Table 1 shows measurement results of a heating temperature at the exposed surface of the cover 160 according to the material of the housing 150 or 250 and whether the heat-dissipating coating layer 170 is applied to the outer surfaces of the housing 150 or 250 in the state in which the heat-dissipating member 140 made of aluminum is disposed on one surface of the magnetic field shielding sheet 120.

TABLE 1

| Housing material | Weight (g) | Existence of heat-dissipating coating layer | Cover surface temperature (° C.) |
|---|---|---|---|
| Aluminum | 75.2 | X | 41.0 |
|  |  | ○ | 40.1 |
| Heat-dissipating member forming composition | 50.8 | X | 40.5 |
|  |  | ○ | 40.3 |
| Heat-dissipating member forming composition + Aluminum plate | 66.0 | X | 40.5 |
|  |  | ○ | 40.1 |

As can be seen in Table 1 above, it may be confirmed that when the heat-dissipating coating layer 170 is formed on the outer surfaces of the housing 150 or 250, the surface temperature of the cover 160 is reduced in all cases regardless of the material of the housing, and it may be confirmed that when the housing 150 or 250 is realized with the above-described heat-dissipating member forming composition, the weight is reduced and the surface temperature of the cover 160 is reduced in all cases compared to the housing 150 or 250 made of aluminum alone.

Here, as described above, the heat-dissipating member forming composition means a plastic material including the graphite composite A or A', and the heat-dissipating member forming composition+the aluminum plate means a form in which the aluminum plate is integrated with the heat-dissipating member forming composition C including the graphite composite A or A' through insert injection.

Meanwhile, it is noted that when the wireless power transmission device according to the present invention includes the housing 150 or 250 and the cover 160, it is illustrated in the drawings that both the supporting plate 130 and the heat-dissipating member 140 are applied, but the present invention is not limited thereto, and the supporting plate 130 and the heat-dissipating member 140 may be selectively applied, or both may not be applied.

The embodiments of the present invention have been described above. However, it should be noted that the spirit of the present invention is not limited to the embodiments in the specification and those skilled in the art and understanding the present invention may easily suggest other embodiments by addition, modification, and removal of the components within the same spirit, but these are construed as being included in the spirit of the present invention.

The invention claimed is:

1. A wireless power transmission device comprising:
   at least one wireless power transmission antenna for power transmission;
   a wireless communication antenna formed in an antenna pattern on at least one surface of a circuit board; and
   a magnetic field shielding sheet having a plate shape and disposed on one surface of the wireless power transmission antenna,
   wherein the circuit board on which the wireless communication antenna is formed is disposed to be located above the wireless power transmission antenna,
   wherein the wireless power transmission antenna is formed of a planar coil having a hollow portion, and the wireless communication antenna includes a first patterned portion disposed on a region corresponding to the wireless power transmission antenna and a second patterned portion disposed on a region which does not correspond to the wireless power transmission antenna, and
   wherein the second patterned portion is formed on an edge side along an edge of the circuit board, and the first patterned portion is formed on an inner side of the circuit board to be located on an inner side of the second patterned portion.

2. The wireless power transmission device of claim 1, wherein the first patterned portion is formed such that a portion thereof which is located directly above a coil body of the planar coil has a relatively longer length or wider area than a portion thereof which is located directly above the hollow portion.

3. The wireless power transmission device of claim 1, wherein the first patterned portion is formed such that a portion thereof which is located directly above a coil body of the planar coil has a relatively shorter length or narrower area than a portion thereof which is located directly above the hollow portion.

4. The wireless power transmission device of claim 1, wherein the wireless power transmission device includes a heat-dissipating member having a plate shape.

5. A wireless power transmission device comprising:
   a magnetic field shielding sheet having a plate shape and a predetermined area;
   at least one wireless power transmission antenna disposed on a first surface of the magnetic field shielding sheet;
   a wireless communication antenna formed in an antenna pattern on at least one surface of a circuit board; and
   a supporting plate which is made of a plastic material having a heat-dissipating property and includes one or more seating grooves respectively formed on a first surface and a second surface which are opposite to each other,
   wherein the circuit board is disposed on a second surface of the magnetic field shielding sheet which is a surface opposite to the first surface,
   wherein the wireless power transmission antenna is formed of a plurality of planar coils, each of which is disposed to be inserted into each of the seating grooves.

6. The wireless power transmission device of claim 5, wherein the circuit board includes a protruding region which protrudes outward from an edge of the magnetic field shielding sheet, and the wireless communication antenna is patterned in the protruding region.

7. The wireless power transmission device of claim 5, further comprising a heat-dissipating member having a plate shape and disposed on one surface of the circuit board, wherein the heat-dissipating member is formed of a thin metal sheet.

8. The wireless power transmission device of claim 1, further comprising a supporting plate which is made of a plastic material having a heat-dissipating property and includes one or more seating grooves respectively formed on a first surface and a second surface which are opposite to each other, wherein the wireless power transmission antenna is formed of a plurality of planar coils, each of which is disposed to be inserted into each of the seating grooves.

9. The wireless power transmission device of claim 8, wherein one of the plurality of planar coils is disposed in a first seating groove formed on the first surface, and the remaining planar coils are disposed in a second seating groove formed on the second surface.

10. A wireless power transmission device of claim 1, further comprising:
a housing including at least one circuit board built therein for an overall operation and configured to release heat generated by a heat source; and
a heat-dissipating coating layer applied to an outer surface of the housing to improve a heat-dissipating property.

11. The wireless power transmission device for a vehicle of claim 10, wherein the heat-dissipating coating layer includes a coating layer forming component including a main resin, a carbon-based filler contained in an amount of 8 to 72 parts by weight with respect to 100 parts by weight of the main resin, and a physical property enhancing component configured to improve a heat-dissipating property and an adhesive property.

12. The wireless power transmission device for a vehicle of claim 11, wherein the main resin is formed of a glycidyl ether type epoxy resin including a bisphenol A type epoxy resin.

13. The wireless power transmission device for a vehicle of claim 10, wherein the housing is formed of a heat-dissipating member forming composition including a graphite composite in which nano metal particles crystallized on a surface of graphite are bonded and a polymer resin in which the graphite composite forms a dispersed phase.

14. A wireless power transmission device of claim 5, further comprising:
a housing including at least one circuit board built therein for an overall operation and configured to release heat generated by a heat source; and
a heat-dissipating coating layer applied to an outer surface of the housing to improve a heat-dissipating property.

15. The wireless power transmission device for a vehicle of claim 14, wherein the heat-dissipating coating layer includes a coating layer forming component including a main resin, a carbon-based filler contained in an amount of 8 to 72 parts by weight with respect to 100 parts by weight of the main resin, and a physical property enhancing component configured to improve a heat-dissipating property and an adhesive property.

16. The wireless power transmission device for a vehicle of claim 15, wherein the housing is formed of a heat-dissipating member forming composition including a graphite composite in which nano metal particles crystallized on a surface of graphite are bonded and a polymer resin in which the graphite composite forms a dispersed phase.

17. The wireless power transmission device for a vehicle of claim 15, wherein the main resin is formed of a glycidyl ether type epoxy resin including a bisphenol A type epoxy resin.

18. A wireless power transmission device comprising:
at least one wireless power transmission antenna for power transmission;
a wireless communication antenna formed in an antenna pattern on at least one surface of a circuit board;
a magnetic field shielding sheet having a plate shape and disposed on one surface of the wireless power transmission antenna; and
a supporting plate which is made of a plastic material having a heat-dissipating property and includes one or more seating grooves respectively formed on a first surface and a second surface which are opposite to each other,
wherein the circuit board on which the wireless communication antenna is formed is disposed to be located above the wireless power transmission antenna,
wherein the wireless power transmission antenna is formed of a plurality of planar coils, each of which is disposed to be inserted into each of the seating grooves, and
wherein one of the plurality of planar coils is disposed in a first seating groove formed on the first surface, and the remaining planar coils are disposed in a second seating groove formed on the second surface.

* * * * *